(12) United States Patent
Oh et al.

(10) Patent No.: US 10,937,938 B2
(45) Date of Patent: Mar. 2, 2021

(54) LIGHT EMITTING DEVICE

(71) Applicant: SEOUL VIOSYS CO., LTD., Gyeonggi-do (KR)

(72) Inventors: Se Hee Oh, Gyeonggi-do (KR); Min Woo Kang, Gyeonggi-do (KR); Jong Kyu Kim, Gyeonggi-do (KR); Hyun A Kim, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/536,819

(22) Filed: Aug. 9, 2019

(65) Prior Publication Data
US 2020/0052175 A1    Feb. 13, 2020

(30) Foreign Application Priority Data

Aug. 9, 2018   (KR) .................. 10-2018-0093387
Jul. 15, 2019  (KR) .................. 10-2019-0085111

(51) Int. Cl.
*H01L 33/62*   (2010.01)
*H01L 27/15*   (2006.01)

(52) U.S. Cl.
CPC ............ *H01L 33/62* (2013.01); *H01L 27/156* (2013.01)

(58) Field of Classification Search
CPC .... H01L 33/62; H01L 27/156; H01L 27/3204
USPC ........................................................ 257/72
See application file for complete search history.

(56) References Cited

U.S. PATENT DOCUMENTS

2015/0349207 A1* 12/2015 Sogo .................. H01L 33/0093
                                                         257/99
2019/0189680 A1     6/2019  Oh et al.

FOREIGN PATENT DOCUMENTS

EP            3454372 A1     3/2019

OTHER PUBLICATIONS

European Search Report Application No. 19191010.8-1211 dated Jan. 29, 2020, 6 pages.

* cited by examiner

*Primary Examiner* — Dzung Tran
(74) *Attorney, Agent, or Firm* — Burris Law, PLLC

(57) ABSTRACT

A light emitting device includes a first light emitting cell, a second light emitting cell, a first conductive pattern, a second conductive pattern, and a connection pattern. The connection pattern includes contact portions electrically connected to a second conductivity type semiconductor layer of the first light emitting cell and a first conductivity type semiconductor layer of the second light emitting cell. At an edge of a first region facing the second light emitting cell, one contact portion of the first conductive pattern is disposed between the contact portions of the connection pattern electrically connected to the second conductivity type semiconductor layer of the first light emitting cell, and one contact portion of the first conductive pattern is open outwards.

20 Claims, 24 Drawing Sheets

LIGHT EMITTING DEVICE

PRIORITY CLAIMS AND CROSS-REFERENCE TO RELATED APPLICATION

This patent document claims priority to and the benefit of Korean Patent Application Nos. 10-2018-0093387, filed on Aug. 9, 2018, and 10-2019-0085111, filed on Jul. 15, 2019, which are incorporated by reference for all purposes as if fully set forth herein.

TECHNICAL FIELD

Exemplary embodiments of the present disclosure relate to a light emitting device and, more particularly, to a light emitting device including a plurality of light emitting cells.

BACKGROUND

A light emitting diode is used as an inorganic light source in various fields including, a display apparatus, a vehicular lamp, general lighting, and the like. With various advantages, such as long lifespan, low power consumption, and rapid response speed, light emitting diodes are rapidly replacing existing light sources.

Unlike an existing method of constituting a circuit through physical connection of a plurality of light emitting diode (LED) devices, an LED device including a plurality of chips connected in series to one another therein to be operated at high voltage is under development in the art.

SUMMARY

Exemplary embodiments of the present disclosure provide a light emitting device having high luminous efficacy. The above and other objects, aspects and features of the present disclosure will become apparent to those skilled in the art from the following detailed description.

In accordance with one exemplary embodiment of the present disclosure, a light emitting device includes: a first light emitting cell disposed in a first region on a substrate and including a first conductivity type semiconductor layer, an active layer, and a second conductivity type semiconductor layer; a second light emitting cell disposed in a second region on the substrate to be spaced apart from the first light emitting cell and including a first conductivity type semiconductor layer, an active layer, and a second conductivity type semiconductor layer; a first conductive pattern disposed in the first region and including contact portions electrically connected to the first conductivity type semiconductor layers; and a connection pattern including contact portions electrically connected to the second conductivity type semiconductor layer of the first light emitting cell and contact portions electrically connected to the first conductivity type semiconductor layer of the second light emitting cell, wherein, at an edge of the first region facing the second light emitting cell, one contact portion of the first conductive pattern is disposed between the contact portions of the connection pattern electrically connected to the second conductivity type semiconductor layer of the first light emitting cell, and the one contact portion of the first conductive pattern is open outwards.

According to exemplary embodiments, the contact portions of the first conductive pattern may be disposed along the edge of the first region. According to exemplary embodiments, one sidewall of each of the contact portions of the first conductive pattern may face the active layer and the second conductivity type semiconductor layer of the first light emitting cell and the other sidewall thereof may face a separation space.

According to exemplary embodiments, the first conductive pattern may include concave portions formed on a side surface of the first region facing the second light emitting cell to be indented into the first conductive pattern; the connection pattern may include convex portions electrically contacting the contact portions of the connection pattern electrically connected to the second conductivity type semiconductor layer and extending from the second region to the first region, and the concave portions and the convex portions may face each other while being spaced apart from each other.

According to exemplary embodiments, the first conductive pattern may further include: protruding regions protruding outwards at locations corresponding to the contact portions of the first conductive pattern.

According to exemplary embodiments, each of the contact portions of the connection pattern electrically connected to the first conductivity type semiconductor layer may be disposed along an edge of the second region, and the connection pattern may further include: protruding regions protruding outwards at locations corresponding to the contact portions of the connection pattern electrically connected to the first conductivity type semiconductor layer.

According to exemplary embodiments, the first region may include a first side surface facing the second light emitting cell, a second side surface opposite to the first side surface, and third and fourth side surfaces each connecting the first side surface to the second side surface; and the second region may include a first side surface facing the first light emitting cell, a second side surface opposite to the first side surface, and third and fourth side surfaces each connecting the first side surface to the second side surface.

According to exemplary embodiments, in the first region, the contact portions of the first conductive pattern formed to face the second light emitting cell may be disposed in a space between the contact portions of the connection pattern electrically connected to the second conductivity type semiconductor layer and the first side surface.

According to exemplary embodiments, in the first region, a total area of the contact portions of the first conductive pattern disposed on the first side surface may be equal to or less than that of the contact portions of the first conductive pattern disposed on the second side surface; and in the second region, a total area of the contact portions of the connection pattern disposed on the first side surface and electrically connected to the first conductivity type semiconductor layer may be equal to or less than that of the contact portions of the connection pattern disposed on the second side surface and electrically connected to the first conductivity type semiconductor layer.

According to exemplary embodiments, the contact portions of the first conductive pattern may have the same structure; in the first region, the number of contact portions of the first conductive pattern disposed on the first side surface may be less than the number of contact portions of the first conductive pattern disposed on the second side surface; the contact portions of the connection pattern electrically connected to the first conductivity type semiconductor layer may have the same structure; and in the second region, the number of contact portions of the connection pattern disposed on the first side surface and electrically connected to the first conductivity type semiconductor layer may be less than the number of contact portions of the connection portions disposed on the second side surface and electrically connected to the first conductivity type semiconductor layer.

According to exemplary embodiments, each of the contact portions of the first conductive pattern disposed at a corner of the first region defined by the second and third side surfaces thereof and at a corner of the first region defined by the second and fourth side surfaces thereof may have an L-shaped structure, and each of the contact portions of the connection pattern electrically connected to the first conductivity type semiconductor layer and disposed at a corner of the second region defined by the second and third side surfaces thereof and at a corner of the second region defined by the second and fourth side surfaces thereof may have an L-shaped structure.

According to exemplary embodiments, each of the first and second light emitting cells may further include: an ohmic layer disposed on the second conductivity type semiconductor layer and electrically contacting the second conductivity type semiconductor layer; an insulation layer disposed on the ohmic layer and having a plurality of holes; and a reflective layer disposed on the insulation layer and including contact portions contacting the ohmic layer through the plurality of holes.

According to exemplary embodiments, one contact portion of the reflective layer of the first light emitting cell may be disposed at a corner of the first region defined by the first and third side surfaces of the first region or by the first and fourth side surfaces of the first region and between two adjacent contact portions of the first conductive pattern electrically connected to the first conductivity type semiconductor layer, and one contact portion of the reflective layer of the second light emitting cell may be disposed at a corner of the second region defined by the first and third side surfaces of the second region or by the first and fourth side surfaces of the second region and between two adjacent contact portions of the connection pattern electrically connected to the first conductivity type semiconductor layer.

According to exemplary embodiments, the light emitting device may further include a floating pattern overlapping a separation space between the first and second light emitting cells and insulated from the first and second light emitting cells, the first conductive pattern, and the connection pattern.

According to exemplary embodiments, the light emitting device may further include a second conductive pattern disposed in the second region and electrically connected to the second conductivity type semiconductor layer.

According to exemplary embodiments, the light emitting device may further include: a first electrode pad electrically connected to the first conductive pattern in the first region; and a second electrode electrically connected to the second conductive pattern in the second region.

According to exemplary embodiments, in the second region, the connection pattern may further include: a contact portion disposed at a center of the second light emitting cell and electrically contacting the first conductivity type semiconductor layer of the second light emitting cell; and a protrusion electrically contacting the contact portion and protruding in a direction from the first region toward the second region.

According to exemplary embodiments, the light emitting device may further include: a second conductive pattern disposed in the second region, electrically connected to the second conductivity type semiconductor layer, and including a first pattern portion, a second pattern portion, and a connecting portion connecting the first and second pattern portions separated by the protrusion of the connection pattern.

According to exemplary embodiments, the light emitting device may further include: a first electrode pad electrically connected to the first conductive pattern in the first region; and second electrode pads electrically connected to the first and second pattern portions of the second conductive pattern in the second region, respectively.

According to exemplary embodiments, the contact portions of the connection pattern electrically connected to the second conductivity type semiconductor layer may be biased to one side with respect to an imaginary vertical line crossing the center of the substrate.

According to exemplary embodiments, the contact portions of the first conductive pattern disposed on a side facing the second light emitting cell may be biased to the other side with respect to the imaginary vertical line.

According to exemplary embodiments, the contact portions of the connection pattern electrically disposed on a side facing the first light emitting cell and electrically connected to the first conductivity type semiconductor layer may be biased to the one side with respect to the imaginary vertical line.

According to exemplary embodiments, the contact portions of the connection pattern electrically connected to the second conductivity type semiconductor layer may be disposed symmetrically with respect to an imaginary vertical line crossing the center of the substrate.

According to exemplary embodiments, the contact portions of the first conductive pattern disposed on a side facing the second light emitting cell may be disposed symmetrically with respect to a vertical line, and the contact portions of the connection pattern disposed on a side facing the first light emitting cell and electrically connected to the first conductivity type semiconductor layer may be disposed symmetrically with respect to the vertical line.

The first light emitting cell may be divided into a plurality of light emitting cells sharing the first conductivity type semiconductor layer and one contact portion of the first conductive pattern may be disposed in a region between the plurality of light emitting cells.

The second light emitting cell may be divided into a plurality of light emitting cells sharing the first conductivity type semiconductor layer and the second conductive pattern may be disposed on each light emitting cell of the second light emitting cell, respectively.

The light emitting device may further include a plurality of first electrode pads electrically connected to the first conductive pattern in the first region; and a plurality of second electrode pads electrically connected to the second conductive pattern in the second region, wherein each of the first electrode pads may be disposed on one of the plurality of light emitting cells of the first light emitting cell and each of the second electrode pads may be disposed on one of the plurality of light emitting cells of the second light emitting cell.

In one exemplary embodiment, the connection pattern may include protrusions extending from the second region to the first region, and at least one of the protrusions may include a neck having a relatively narrow width.

In the light emitting device according to the exemplary embodiments, a first contact portion disposed at an edge of the first light emitting cell facing the second light emitting cell and electrically connected to the first conductivity type semiconductor layer is placed between two adjacent contact portions disposed adjacent to the second light emitting cell and electrically connected to the second conductivity type semiconductor layer, thereby providing high current spreading characteristics through reduction in shifting paths of electrons and holes. Accordingly, the light emitting device has improved overall luminous efficacy.

In addition, the area of an outer surface of the connection pattern disposed in a separation space between the first and second light emitting cells can be minimized, thereby minimizing a possibility of contact between the connection pattern and a semiconductor layer when a first passivation layer insulating the substrate from the connection pattern is damaged by external particles.

Other advantages and effects of the exemplary embodiments of the present disclosure will become apparent from the following detailed description.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 3A to FIG. 9A are plan views illustrating different steps of a method of manufacturing the light emitting diode according to the one exemplary embodiment of the present disclosure.

FIG. 3B to FIG. 9B are cross-sectional views of the light emitting diode taken along line A-A' in FIG. 3A to FIG. 9A.

DETAILED DESCRIPTION OF EMBODIMENTS

Hereinafter, exemplary embodiments of the present disclosure will be described in detail with reference to the accompanying drawings so as to fully convey the spirit of the present disclosure to those skilled in the art. However, it should be understood that the present disclosure is not limited to the following exemplary embodiments and that various modifications, substitutions, and equivalent embodiments can be made by those skilled in the art without departing from the spirit and scope of the present disclosure.

Unless otherwise defined herein, all terms used herein have the same meaning as commonly understood by one of ordinary skill in the art to which this disclosure pertains.

Hereinafter, exemplary embodiments of the present disclosure will be described in detail with reference to the accompanying drawings.

Figure 1A:
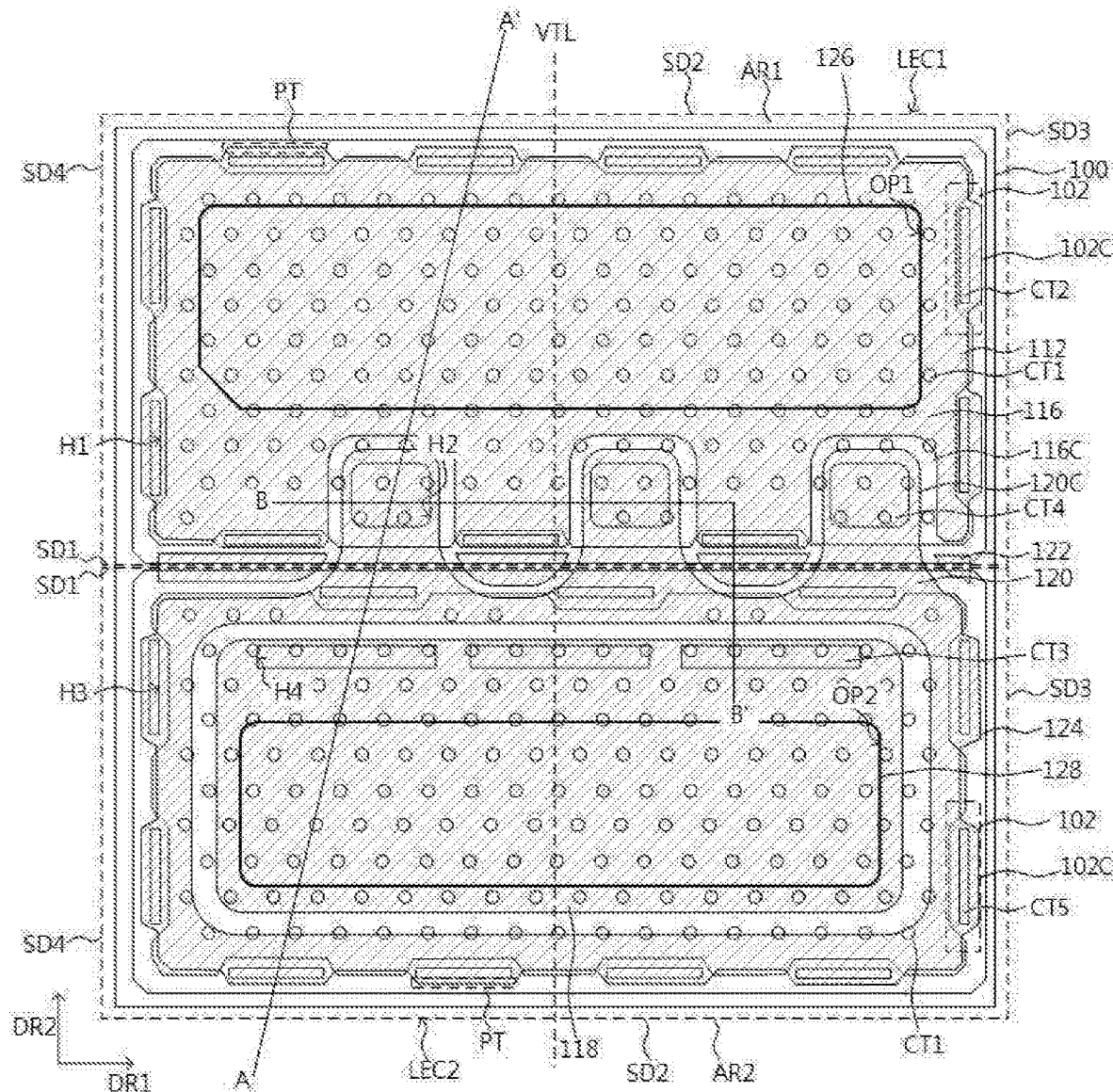
FIG. 1A is a plan view of a light emitting device according to one exemplary embodiment of the present disclosure.
Figure 1B:
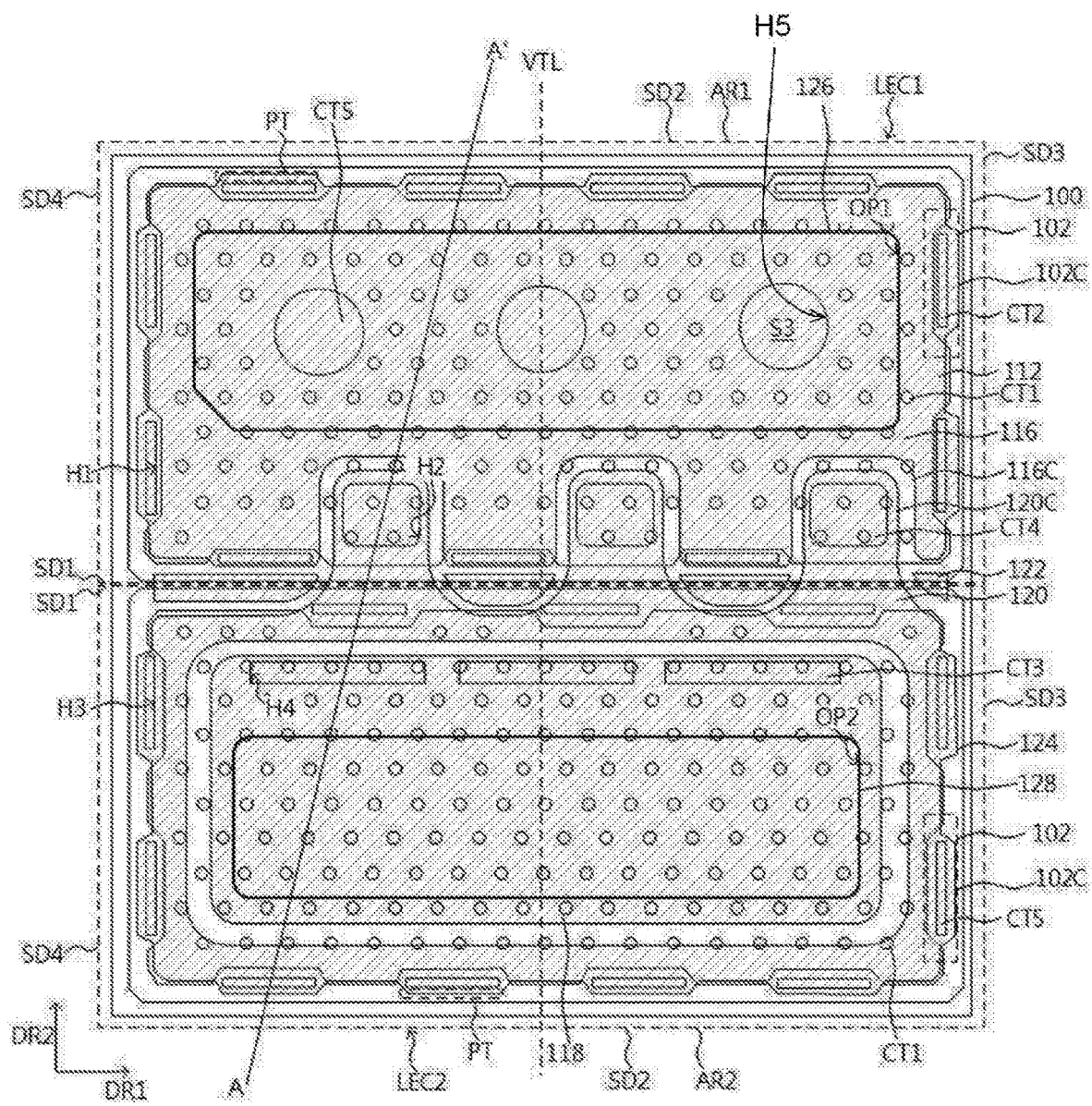
FIG. 1B is a plan view of a light emitting device having openings disposed at a central region of one of light emitting cells according to another exemplary embodiment of the present disclosure.
Figure 1C:
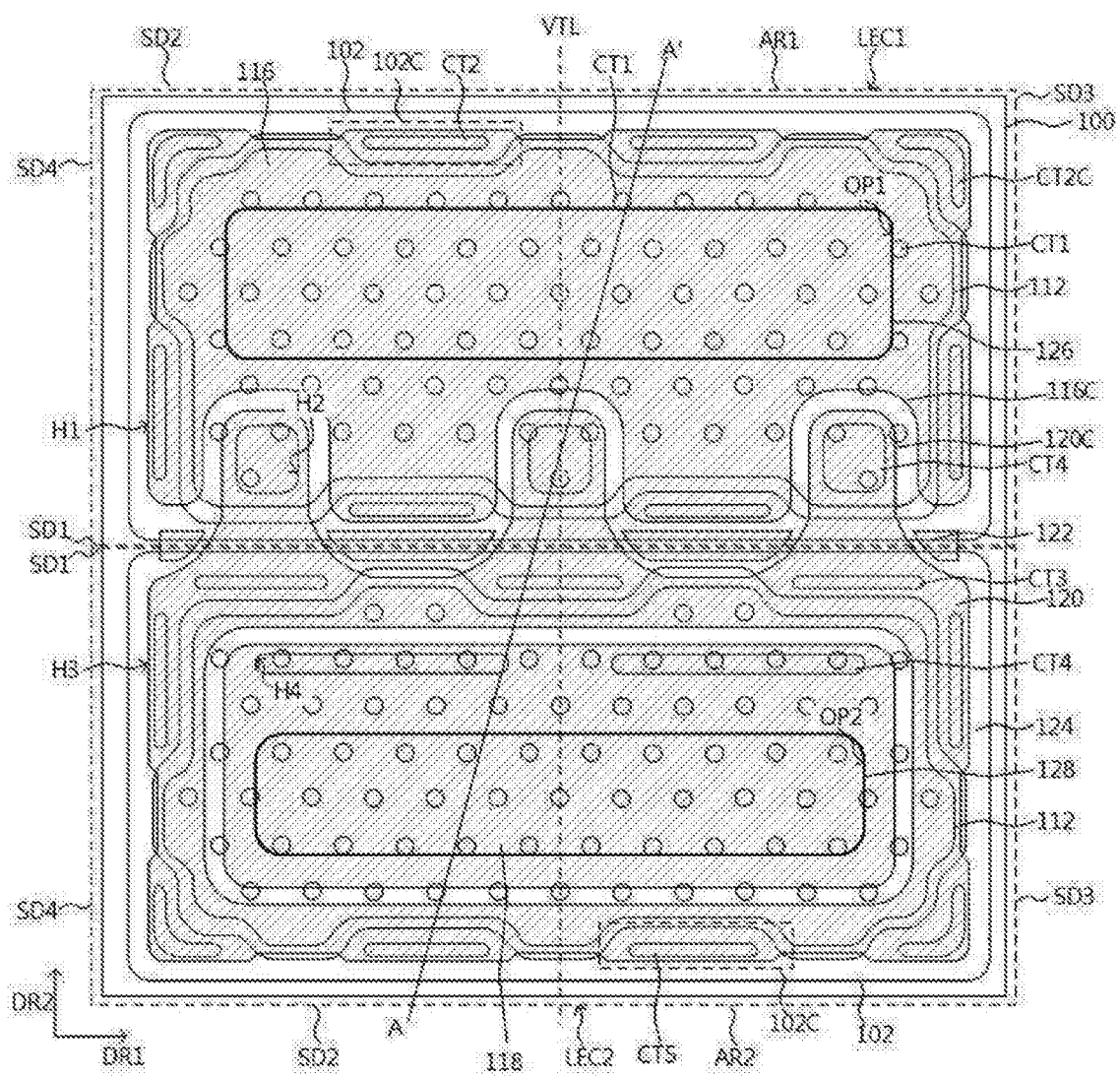
FIG. 1C is a plan view of a light emitting device according to a further exemplary embodiment of the present disclosure.
Figure 1D:
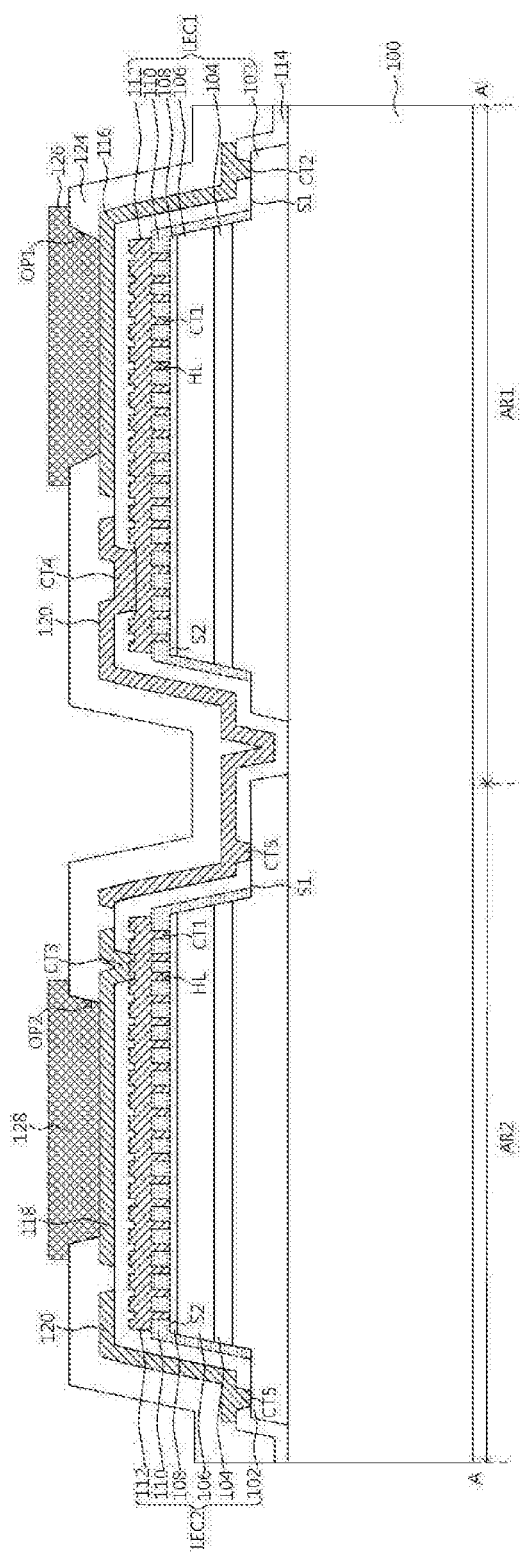
FIG. 1D is a cross-sectional view of the light emitting device taken along line A-A' in each of FIG. 1A to FIG. 1C.
Figure 1E:
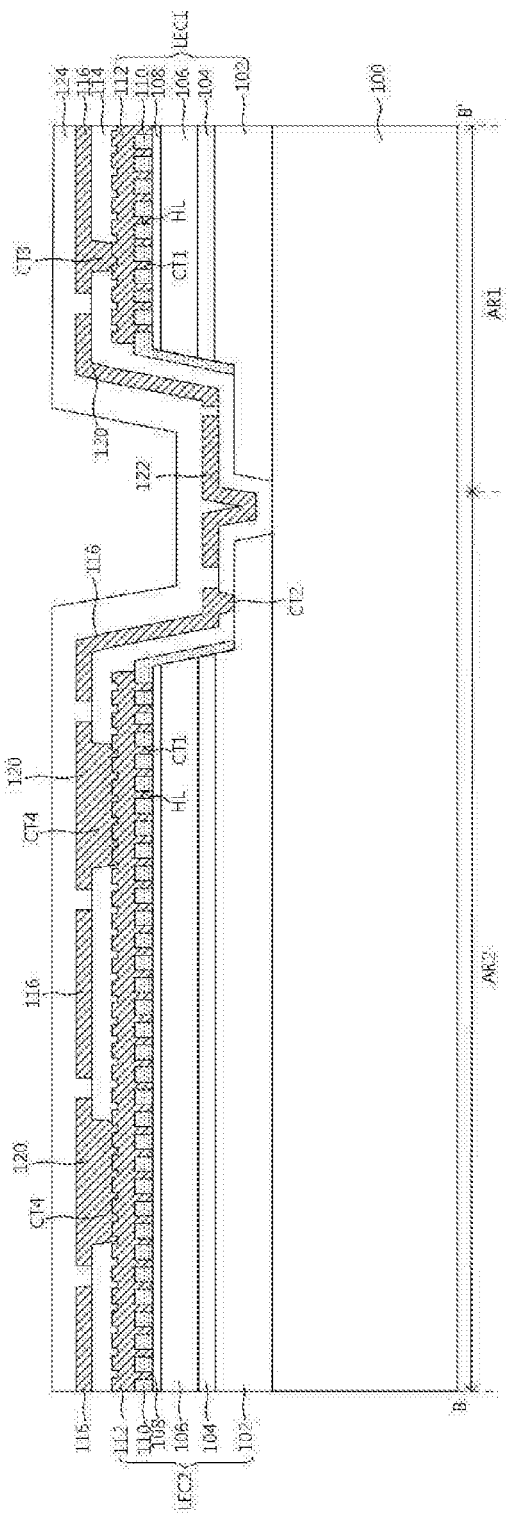
FIG. 1E is a cross-sectional view of the light emitting device taken along line B-B' in FIG. 1A.

FIG. 1A is a plan view of a light emitting device according to one exemplary embodiment of the present disclosure, FIG. 1B is a plan view of a light emitting device according to another exemplary embodiment of the present disclosure, FIG. 1C is a plan view of a light emitting device according to a further exemplary embodiment of the present disclosure, FIG. 1D is a cross-sectional view of the light emitting device taken along line A-A' in each of FIG. 1A to FIG. 1C, and FIG. 1E is a cross-sectional view of the light emitting device taken along line B-B' in FIG. 1A.

Referring to FIG. 1A through FIG. 1E, the light emitting device may include a substrate 100, a plurality of light emitting cells LEC1, LEC2, a first passivation layer 114, a first conductive pattern 116, a second conductive pattern 118, a connection pattern 120, a floating pattern 122, a second passivation layer 124, a first electrode pad 126, and a second electrode pad 128.

The substrate 100 is a substrate allowing growth of a gallium nitride-based semiconductor layer thereon, and may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. The substrate 100 may be a patterned sapphire substrate.

The light emitting cells LEC1, LEC2 may be isolated from each other on the substrate 100. According to one exemplary embodiment, each of the light emitting cells LEC1, LEC2 may have a slanted sidewall.

Each of the light emitting cells LEC1, LEC2 may include a first conductivity type semiconductor layer 102, an active layer 104, a second conductivity type semiconductor layer 106, an ohmic layer 108, an insulation layer 110, and a reflective layer 112 on the substrate 100, as shown in FIG. 1D.

Each of the first conductivity type semiconductor layer 102, the active layer 104 and the second conductivity type semiconductor layer 106 may include a III-V based compound semiconductor, for example, a nitride semiconductor such as (Al, Ga, In)N. The first conductivity type semiconductor layer 102 may be a GaN-based semiconductor layer doped with n-type dopants, for example, silicon (Si). The second conductivity type semiconductor layer 106 may be a GaN-based semiconductor layer doped with p-type dopants, for example, magnesium (Mg). Alternatively, the first conductivity type semiconductor layer 102 may be a p-type semiconductor layer and the second conductivity type semiconductor layer 106 may be an n-type semiconductor layer. Each of the first conductivity type semiconductor layer 102 and the second conductivity type semiconductor layer 106 may be composed of a single layer, without being limited thereto. Alternatively, each of the first and second conductivity type semiconductor layers may include multiple layers or may include a super-lattice layer. The active layer 104 may include a multi-quantum well (MQW) structure and may have a preset composition to emit light having a desired peak wavelength. For example, the active layer 104 may emit light having a peak wavelength in the UV wavelength band or in the blue wavelength band.

Although this exemplary embodiment is illustrated as having two light emitting cells LEC1, LEC2, it should be understood that the number of light emitting cells is not limited thereto. In other embodiments, three or more light emitting cells may be included in a light emitting device. Alternatively, or additionally, a single light emitting cell may be included in a light emitting device. For easy understanding of the description, the two light emitting cells LEC1, LEC2 will be referred to as a first light emitting cell LEC1 and a second light emitting cell LEC2, respectively.

The substrate 100 may include a first region AR1 in which the first light emitting cell LEC1 is disposed, and a second region AR2 in which the second light emitting cell LEC2 is disposed, as shown in FIG. 1D, for example. Each of the first region AR1 and the second region AR2 may have a rectangular structure having a long side in a first direction DR1 in plan view, as shown in FIG. 1A. By way of example, each of the first region AR1 and the second region AR2 may include a first side surface SD1 extending in the first direction DR1 and adjacent to the second light emitting cell LEC2 or the first light emitting cell LEC1, a second side surface SD2 opposite to the first side surface SD1, and a third side surface SD3 and a fourth side surface SD4 extending in a second direction DR2 perpendicular to the first direction DR1 and connecting the first side surface SD1 to the second side surface SD2, as shown in FIG. 1A.

According to one exemplary embodiment, a surface formed by etching an edge of each of the light emitting cells LEC1, LEC2 to expose the first conductivity type semiconductor layer 102 is defined as a first surface S1, as shown in FIG. 1D. In addition, a surface of each of the light emitting cells LEC1, LEC2, which is coplanar with an upper surface of the ohmic layer 108, is defined as a second surface S2. According to the exemplary embodiment, each of the light emitting cells LEC1, LEC2 may have a rectangular structure having a long side in the first direction DR1 in plan view, as shown in FIG. 1A. In addition, the second surface S2 may have a generally rectangular structure in plan view and may include concave regions indented into the light emitting cell. Regions of the first surface S1 exposed by the concave regions of the second surface S2 will be referred to as convex regions 102C of the first surface S1, as shown in FIG. 1A.

In the embodiment shown in FIG. 1B, the light emitting device may further include openings disposed at a central region of one (LEC1) of the light emitting cells LEC1, LEC2 and formed through the ohmic layer 108, the second conductivity type semiconductor layer 106 and the active layer 104 to expose the first conductivity type semiconductor layer 102. Each of the openings may expose third surfaces S3. According to one example embodiment, the third surfaces S3 may be substantially the same plane as the first surface S1.

Referring to FIG. 1A to FIG. 1E, the ohmic layer 108 may be disposed on the second conductivity type semiconductor layer 106 to electrically contact the second conductivity type semiconductor layer 106. For the ohmic layer 108, a transparent conductive oxide (TCO) such as indium tin oxide (ITO) or zinc oxide (ZnO) may be used.

The insulation layer 110 may be disposed on the ohmic layer 108. The insulation layer 110 may include silicon oxide (SiOx) or silicon nitride (SiNx). The insulation layer 110 may include a plurality of holes HL which expose the ohmic layer 108. According to one exemplary embodiment, the plurality of holes HL of the insulation layer 110 may be regularly arranged. By way of example, the plurality of holes HL in a first row may be arranged at constant intervals.

The plurality of holes HL in a second row adjacent to the first row may be arranged at constant intervals to be disposed between adjacent holes in the first row. The holes HL of the first row and the holes HL of the second row may be repeatedly arranged in the second direction DR2 perpendicular to the first direction DR1.

According to one exemplary embodiment, the insulation layer 110 may include an extension portion covering the ohmic layer 108 and extending from an upper surface of the ohmic layer 108 to cover a sidewall connecting the second surface S2 and the first surface S1. Here, the sidewall may include side surfaces of the first conductivity type semiconductor layer, the active layer, and the second conductivity type semiconductor layer.

The reflective layer 112 may be disposed on the insulation layer 110. The reflective layer 112 may reflect light generated from a light emitting layer toward the substrate 100. The reflective layer 112 may include a highly reflective metal, such as Ag or Al. The reflective layer 112 may include first contact portions CT1, which fill the plurality of holes HL of the insulation layer 110 and electrically contact the ohmic layer 108. The first contact portions CT1 may have substantially the same structure and arrangement as the holes HL of the insulation layer 110.

The first passivation layer 114 may be deposited to a uniform thickness on the first light emitting cell LEC1 and the second light emitting cell LEC2 so as not to completely fill a gap between the first light emitting cell LEC1 and the second light emitting cell LEC2. The first passivation layer 114 may include at least one selected from among a distributed Bragg reflector (DBR) formed by alternately stacking silicon oxide ($SiO_2$) and titanium oxide ($TiO_2$), silicon oxide (SiOx), and silicon nitride (SiNx).

According to one exemplary embodiment, the first passivation layer 114 may include first holes H1 formed along an edge of the first region AR1 to expose the first conductivity type semiconductor layer 102 of the first surface H1, second holes H2 exposing the reflective layer 112 of the first light emitting cell LEC1 disposed in the first region AR1, third holes H3 formed along an edge of the second region AR2 to expose the first conductivity type semiconductor layer 102 of the first surface H1, and fourth holes H4 exposing the reflective layer 112 of the second light emitting cell LEC2 disposed in the second region AR2, as shown in FIG. 1A.

According to the embodiments shown in FIG. 1A, FIG. 1B, FIG. 1D, and FIG. 1E, the first holes H1 may expose convex portions 102C of the first conductivity type semiconductor layer 102 in the first region AR1. In plan view, the first holes H1 disposed adjacent to the first side surface SD1 and the second side surface SD2 in the first region AR1 may have a rectangular structure extending in the first direction DR1, and the first holes H1 disposed adjacent to the third side surface SD3 and the fourth side surface SD4 in the first region AR1 may have a rectangular structure extending in the second direction DR2. In these embodiments, the first holes H1 on side surfaces SD1, SD2, SD3, and SD4 may have substantially the same size and the same structure. In other embodiments, the size and the structure of the first holes H1 may not be limited and differ.

According to the embodiment shown in FIG. 1C, among the plural first holes H1, the first holes H1 arranged parallel to the first to fourth side surfaces SD1, SD2, SD3, SD4 may expose some portions of the first conductivity type semiconductor layer 102 exposed by the convex portions 102C in the first region AR1, respectively. In plan view, the first holes H1 disposed adjacent to the first side surface SD1 and the second side surface SD2 in the first region AR1 may have a rectangular structure extending in the first direction DR1, and the first holes H1 disposed adjacent to the third side surface SD3 and the fourth side surface SD4 in the first region AR1 may have a rectangular structure extending in the second direction DR2. In addition, among the plural first holes H1, each of the first holes H1 disposed at a corner defined by the second side surface SD2 and the third side surface SD3 and at a corner defined by the second side surface SD2 and the fourth side surface SD4 may have an 'L'-shaped structure in plan view. Specifically, the first hole H1 disposed at the corner defined by the second side surface SD2 and the third side surface SD3 may extend along the second side surface SD2, be bent at the corner, and extend along the third side surface SD3. Here, a portion of the first hole extending along the second side surface SD2 may have substantially the same length as a portion of the first hole extending along the third side surface SD3. In addition, the first hole H1 disposed at the corner defined by the second side surface SD2 and the fourth side surface SD4 may extend along the second side surface SD2, be bent at the corner, and extend along the fourth side surface SD4. Here, a portion of the first hole extending along the second side surface SD2 may have substantially the same length as a portion of the first hole extending along the fourth side surface SD4. As shown in FIG. 1C, the first holes H1 having an 'L'-shaped structure are not formed at portions at which the first light emitting cell LEC1 faces the second light emitting cell LEC2, that is, at a corner defined by the first side surface SD1 and the third side surface SD3 or at a corner defined by the first side surface SD1 and the fourth side surface SD4.

Referring to FIG. 1A through FIG. 1E, the second holes H2 may be disposed adjacent to the first side surface SD1 in the first region AR1 and may expose the reflective layer 112 of the first light emitting cell LEC1. The second holes H2 may be arranged at constant intervals. By way of example, each of the second holes H2 may have a rectangular structure in plan view. According to one exemplary embodiment, one first hole H1 may be disposed between two adjacent second holes H2.

The third holes H3 may expose the convex portions 102C of the first conductivity type semiconductor layer 102 of the second light emitting cell LEC2, respectively. According to the embodiments shown in FIG. 1A and FIG. 1B, in plan view, the third holes H3 disposed adjacent to the first side surface SD1 and the second side surface SD2 in the second region AR2 may have a rectangular structure extending in the first direction DR1, and the third holes H3 disposed adjacent to the third side surface SD3 and the fourth side surface SD4 in the second region AR2 may have a rectangular structure extending in the second direction DR2. In these embodiments, the third holes H3 may have substantially the same size and the same structure, but the present disclosure is not limited thereto.

According to the embodiment shown in FIG. 1C, among the plural third holes H3, the third holes H3 arranged parallel to the first to fourth side surfaces SD1, SD2, SD3, SD4 may expose some portions of the first conductivity type semiconductor layer 102 exposed by the convex portions 102C in the second region AR2, respectively. In plan view, the third holes H3 disposed adjacent to the first side surface SD1 and the second side surface SD2 in the second region AR2 may have a rectangular structure extending in the first direction DR1, and the third holes H3 disposed adjacent to the third side surface SD3 and the fourth side surface SD4 in the second region AR2 may have a rectangular structure extending in the second direction DR2. In addition, among the plural third holes H3, each of the third holes H3 disposed at a corner defined by the second side surface SD2 and the third side surface SD3 and at a corner defined by the second side surface SD2 and the fourth side surface SD4 may have an 'L'-shaped structure in plan view. Specifically, the third hole H3 disposed at the corner defined by the second side surface SD2 and the third side surface SD3 may extend along the second side surface SD2, be bent at the corner, and extend along the third side surface SD3. Here, a portion of the third hole extending along the second side surface SD2 may have substantially the same length as a portion of the third hole extending along the third side surface SD3. In addition, the third hole H3 disposed at the corner defined by the second side surface SD2 and the fourth side surface SD4 may extend along the second side surface SD2, be bent at the corner, and extend along the fourth side surface SD4. Here, a portion of the third hole extending along the second side surface SD2 may have substantially the same length as a portion of the third hole extending along the fourth side surface SD4. As shown in FIG. 1C, the third holes H3 having an 'L'-shaped structure are not formed at portions at which the first light emitting cell LEC1 faces the second light emitting cell LEC2, that is, at a corner defined by the first side surface SD1 and the third side surface SD3 or at a corner defined by the first side surface SD1 and the fourth side surface SD4.

Referring to FIG. 1A through FIG. 1E, the fourth holes H4 may expose the reflective layer 112 of the second light emitting cell LEC2. The fourth holes H4 may be arranged at constant intervals. By way of example, each of the fourth holes H4 may have a rectangular structure extending in the first direction DR1 in plan view.

According to the embodiment of FIG. 1B, the first passivation layer 114 may include fifth holes H5 exposing the third surfaces S3 of the first light emitting cell LEC1 in the first region AR1. The fifth holes H5 may expose the first conductivity type semiconductor layer 102 around the center of the first light emitting cell LEC1. The fifth holes H5 may be arranged at constant intervals. By way of example, each of the fifth holes H5 may have a circular shape in plan view.

Referring to FIG. 1A through FIG. 1E, the first conductive pattern 116, the second conductive pattern 118, the connection pattern 120, and the floating pattern 122 may be disposed on the first passivation layer 114. Each of the first conductive pattern 116, the second conductive pattern 118, the connection pattern 120, and the floating pattern 122 may include a highly reflective metal, such as Ag or Al, and may emit light generated from a light emitting layer toward the substrate 100.

The first conductive pattern 116 may have a generally rectangular structure in plan view and may include concave portions 116C indented into the first region AR1 on the first side surface SD1 in the first region AR1. The first conductive pattern 116 may be disposed in the first region AR1 so as not to cover a separation space between the first light emitting cell LEC1 and the second light emitting cell LEC2.

The first conductive pattern 116 may include second contact portions CT2, which fill the first holes H1 of the first passivation layer 114 and electrically contact the first conductivity type semiconductor layer 102, in the first region AR1. According to one exemplary embodiment, the first conductive pattern 116 may have a plurality of protruding regions PT covering the second contact portions CT2 and protruding toward an outside of the first light emitting cell LEC1.

According to one exemplary embodiment, each of the second contact portions CT2 may have one sidewall facing the first active layer 104 and the other sidewall open outwards and facing a separation space. For example, one sidewall of the second contact portion CT2 may face a portion of the first conductivity type semiconductor layer 102 and the first active layer 104. That is, the second contact portion CT2 may be selectively connected to the first conductivity type semiconductor layer 102, which is exposed through the first active layer 104, the second conductivity type semiconductor layer 106, the ohmic layer 108, and the reflective layer 110, through the first hole H1 of the first passivation layer 114, instead of having a through-hole structure formed by etching the first active layer 104, the second conductivity type semiconductor layer 106, the ohmic layer 108, and the reflective layer 110 to pass therethrough.

According to the embodiment shown in FIG. 1B, the first conductive pattern 116 may include sixth contact portions, which fill the fifth holes H5 of the first passivation layer 114 and electrically contact the first conductivity type semiconductor layer 102, in the first region AR1.

According to the embodiments shown in FIG. 1A, FIG. 1B, FIG. 1D, and FIG. 1E, each of the second contact portions CT2 may have a rectangular structure parallel to the first to fourth side surfaces SD1, SD2, SD3, SD4 in plan view. By way of example, each of the second contact portions CT2 disposed adjacent to the first and second side surface SD1, SD2 may have a rectangular structure extending in the first direction DR1, and each of the second contact portions CT2 disposed adjacent to the third and fourth side surfaces SD3, SD4 may have a rectangular structure extending in the second direction DR2.

According to one exemplary embodiment, in the first region AR1, the total area of the second contact portions CT2 disposed on the first side surface SD1 may be smaller than that of the second contact portions CT2 disposed on the second side surface SD2. By way of example, when the second contact portions CT2 have the same size, the number of second contact portions CT2 disposed on the first side surface SD1 may be smaller than the number of second contact portions CT2 disposed on the second side surface SD2. In addition, the second contact portions CT2 disposed on the first side surface SD1 may be biased to one side with respect to an imaginary vertical line VTL crossing the center of the substrate 100. By way of example, three second contact portions CT2 may be arranged at constant intervals and the center of the second contact portion CT2 disposed at the middle of the three second contact portions CT2 may be biased to one side with respect to the imaginary vertical line VTL.

According to the exemplary embodiment shown in FIG. 1C, each of the second contact portions CT2 disposed parallel to the first to fourth side surfaces SD1, SD2, SD3, SD4 may have a rectangular structure parallel to the first to fourth side surfaces SD1, SD2, SD3, SD4. By way of example, each of the second contact portions CT2 disposed on the first and second side surfaces SD1, SD2 may have a rectangular structure extending in the first direction DR1, and each of the second contact portions CT2 disposed on the third and fourth side surfaces SD3, SD4 may have a rectangular structure extending in the second direction DR2. In addition, each of the second contact portions CT2C disposed at the corner defined by the second side surface SD2 and the third side surface SD3 and at the corner defined by the second side surface SD2 and the fourth side surface SD4 may have an 'L'-shaped structure in plan view. According to one exemplary embodiment, in the first region AR1, the total area of the second contact portions CT2 disposed on the first side surface SD1 may be substantially equal to or smaller than that of the second contact portions CT2 disposed on the second side surface SD2. In addition, the second contact portions CT2 disposed on the first side surface SD1 may be disposed symmetrically with respect to the imaginary vertical line VTL. By way of example, the middle between two second contact portions CT2 may be disposed on the imaginary vertical line VTL.

Referring to FIG. 1A through FIG. 1E, the second conductive pattern 118 may further include third contact portions CT3, which fill the fourth holes H4 of the first passivation layer 114 and electrically contact the reflective layer 112, in the second region AR2. According to one exemplary embodiment, the second conductive pattern 118 may have a rectangular structure in plan view. In addition, the second conductive pattern 118 may be disposed in the second region AR2 so as not to cover the separation space between the first light emitting cell LEC1 and the second light emitting cell LEC2.

The connection pattern 120 may include fourth contact portions CT4, which fill the second holes H2 of the first passivation layer 114 and electrically contact the reflective layer 112 in the first region AR1, and fifth contact portions CT5, which fill the third holes H3 of the first passivation layer 114 and electrically contact the first conductivity type semiconductor layer 102 in the second region AR2. The connection pattern 120 may electrically connect the reflective layer 112 (the second conductivity type semiconductor layer 106) of the first light emitting cell LEC1 to the first conductivity type semiconductor layer 102 of the second light emitting cell LEC2.

According to one exemplary embodiment, the connection pattern 120 may have a rectangular ring structure spaced apart from the second conductive pattern 118 and surrounding the second conductive pattern 118 in plan view, and may include convex portions 120C (FIGS. 1A to 1C) protruding from the first side surface SD1 of the second region AR2 toward the first region AR1. The convex portions 120C of the connection pattern 120 may electrically contact the fourth contact portions CT4, respectively. In addition, the convex portions 120C of the connection pattern 120 may be spaced apart from the concave portions 116C of the first conductive pattern 116 and face the concave portions 116C of the first conductive pattern 116, respectively. According to one exemplary embodiment, the connection pattern 120 may have a plurality of protruding regions PT each covering the fifth contact portions CT5 and protruding toward an outside of the second light emitting cell LEC2. By way of example, the protruding regions PT of the connection pattern 120 may be disposed on the second side surface SD2, the third side surface SD3, and the fourth side surface SD4 in the second region.

According to one exemplary embodiment, in the first region, among the plural second contact portions CT2, the second contact portions CT2 disposed adjacent to the first side surface SD1 may be disposed in a space between the fourth contact portions CT4 and the first side surface SD1.

According to the embodiments shown in FIG. 1A, FIG. 1B, FIG. 1D, and FIG. 1E, the fourth contact portions CT4 may be biased to the other side with respect to the imaginary vertical line VTL crossing the center of the substrate 100. By way of example, three fourth contact portions CT4 may be arranged at constant intervals and the center of the fourth contact portion CT4 disposed at the middle of the three fourth contact portions CT4 may be biased to the other side with respect to the imaginary vertical line VTL. According to the exemplary embodiment shown in FIG. 1C, the fourth contact portions CT4 may be disposed symmetrically with respect to the imaginary vertical line VTL. By way of example, three fourth contact portions CT4 may be arranged at constant intervals and the center of the fourth contact portion CT4 disposed at the middle of the three fourth contact portions CT4 may be disposed on the imaginary vertical line VTL.

Referring to FIG. 1A through FIG. 1E, the connection pattern 120 may partially cover the separation space between the first light emitting cell LEC1 and the second light emitting cell LEC2. The connection pattern 120 may reflect light generated from the active layer 108 of each of the first light emitting cell LEC1 and the second light emitting cell LEC2 toward the substrate 100. By way of example, not only the connection pattern 120 but also the floating patterns 122 may be disposed in the separation space between the first light emitting cell LEC1 and the second light emitting cell LEC2 to cover 40% or more of the separation space therebetween with a pattern composed of a reflective material, thereby improving reflectivity with respect to light generated from the active layer 108.

On the other hand, according to one exemplary embodiment, the connection pattern 120 may have a structure not covering an edge region of the light emitting device. The connection pattern 120 is insulated from the substrate 100 by the first passivation layer 114, and the first passivation layer 114 can be damaged due to external particles and contact the connection pattern 120 and the first conductivity type semiconductor layer 102. In particular, the first passivation layer 114 placed in the edge region of light emitting device is vulnerable to external particles. Accordingly, in order to minimize such a possibility, the connection pattern 120 may have a structure not covering the separation space between the first light emitting cell LEC1 and the second light emitting cell LEC2 at the edge of the light emitting device.

According to one exemplary embodiment, the separation space between the first light emitting cell LEC1 and the second light emitting cell LEC2 can generate insignificant light emission, thereby forming a dark portion. In addition, the ohmic layer has a thin thickness of 200 Å to provide uneven current spreading effects. Accordingly, in this exemplary embodiment, one second contact portion CT2 electrically connected to the first conductivity type semiconductor layer 102 is disposed between two adjacent fourth contact portions CT4 electrically connected to the second conductivity type semiconductor layer 106 to facilitate recombination of electrons and holes, thereby ensuring that the separation space between the first light emitting cell LEC1 and the second light emitting cell LEC2 exhibits similar luminous characteristics to other portions of the first light emitting cell and the second light emitting cell.

Further, according to one exemplary embodiment, in the first region AR1, one first contact portion CT1 may be disposed at the corner defined by the first side surface SD1 and the fourth side surface SD4, and the second contact portions CT2 may be disposed at both sides of the corner defined by the first side surface SD1 and the fourth side surface SD4. The first contact portion CT1 may be electrically connected to the second conductivity type semiconductor layer 106 and the second contact portions CT2 may be electrically connected to the first conductivity type semiconductor layer 102. As such, formation of the first contact portions CT1 between two adjacent contact portions CT2 results in decrease in shifting distance of holes and electrons, thereby providing high current spreading characteristics. In the same way, in the second region AR2, one first contact portion CT1 may be disposed at the corner defined by the first side surface SD1 and the third side surface SD3, and the fifth contact portions CT5 may be disposed at both sides of the corner defined by the first side surface SD1 and the third side surface SD3. The first contact portion CT1 may be electrically connected to the second conductivity type semiconductor layer 106 and the fifth contact portions CT5 may be electrically connected to the first conductivity type semiconductor layer 102. Accordingly, the separation space between the first light emitting cell LEC1 and the second light emitting cell LEC2 can exhibit similar luminous characteristics to other portions of the first light emitting cell and the second light emitting cell.

Referring to FIG. 1A through FIG. 1E, the floating pattern 122 may be electrically insulated from the first conductive pattern 116, the second conductive pattern 118, and the connection pattern 120, and may also be electrically insulated from each of the first and second light emitting cells LEC1, LEC2. According to one exemplary embodiment, the floating pattern 122 may be disposed between the first conductive pattern 116 and the connection pattern 120 in plan view. By way of example, one surface of the floating pattern 122 may correspond to the first conductive pattern 116 and the other surface of the floating pattern 122 may correspond to the connection pattern 120. The floating pattern may include a highly reflective metal, such as Ag or Al, to reflect light generated from the first active layer and the second active layer toward the substrate. In addition, the floating pattern 122 including the metal can achieve more efficient dissipation of heat from the light emitting device.

The second passivation layer 124 may be disposed on the first conductive pattern 116, the second conductive pattern 118, the connection pattern 120, and the floating pattern 122. The second passivation layer 124 may be deposited to a uniform thickness so as not to completely fill a gap between the first light emitting cell LEC1 and the second light emitting cell LEC2 on which the first conductive pattern 116, the second conductive pattern 118, the connection pattern 120, and the floating pattern 122 are disposed. On the other hand, the second passivation layer 124 may include at least one selected from among a distributed Bragg reflector (DBR) formed by alternately stacking silicon oxide ($SiO_2$) and titanium oxide ($TiO_2$), silicon oxide (SiOx), and silicon nitride (SiNx). By way of example, in a structure wherein the first passivation layer 114 includes a distributed Bragg reflector (DBR) formed by alternately stacking silicon oxide ($SiO_2$) and titanium oxide ($TiO_2$), and the second passivation layer 124 includes a distributed Bragg reflector (DBR) formed by alternately stacking silicon oxide ($SiO_2$) and titanium oxide ($TiO_2$), the alternating sequence and composition ratio of silicon oxide ($SiO_2$) and titanium oxide ($TiO_2$) of the second passivation layer 124 may be different from those of the first passivation layer 114.

According to one exemplary embodiment, the second passivation layer 124 may include a first opening OP1 exposing the first conductive pattern 116 and a second opening OP2 exposing the second conductive pattern 118, as shown in FIG. 1D.

The first electrode pad 126 and the second electrode pad 128 may be disposed on the second passivation layer 124. The first electrode pad 126 and the second electrode pad 128 may have a structure in which Ni and Ti are alternately stacked one above another.

The first electrode pad 126 may fill the first opening OP1 to be electrically connected to the first conductive pattern 116. As described above, the first electrode pad 126 may be electrically connected to the first conductivity type semiconductor layer 102, which electrically contacts the second contact portions CT2 of the first conductive pattern 116, through the first conductive pattern 116. By way of example, when the first conductivity type semiconductor layer 102 is an n-type semiconductor layer, negative voltage may be applied thereto through the first electrode pad 126.

The second electrode pad 128 may fill the second opening OP2 to be electrically connected to the second conductive pattern 118. As described above, the second electrode pad 128 may be electrically connected to the second conductivity type semiconductor layer 106, which electrically contacts the ohmic layer 108, through the reflective layer 112 which electrically contacts the third contact portions CT3 of the second conductive pattern 118. By way of example, when the second conductivity type semiconductor layer 106 is a p-type semiconductor layer, positive voltage may be applied thereto through the second electrode pad 128.

Figure 2A:
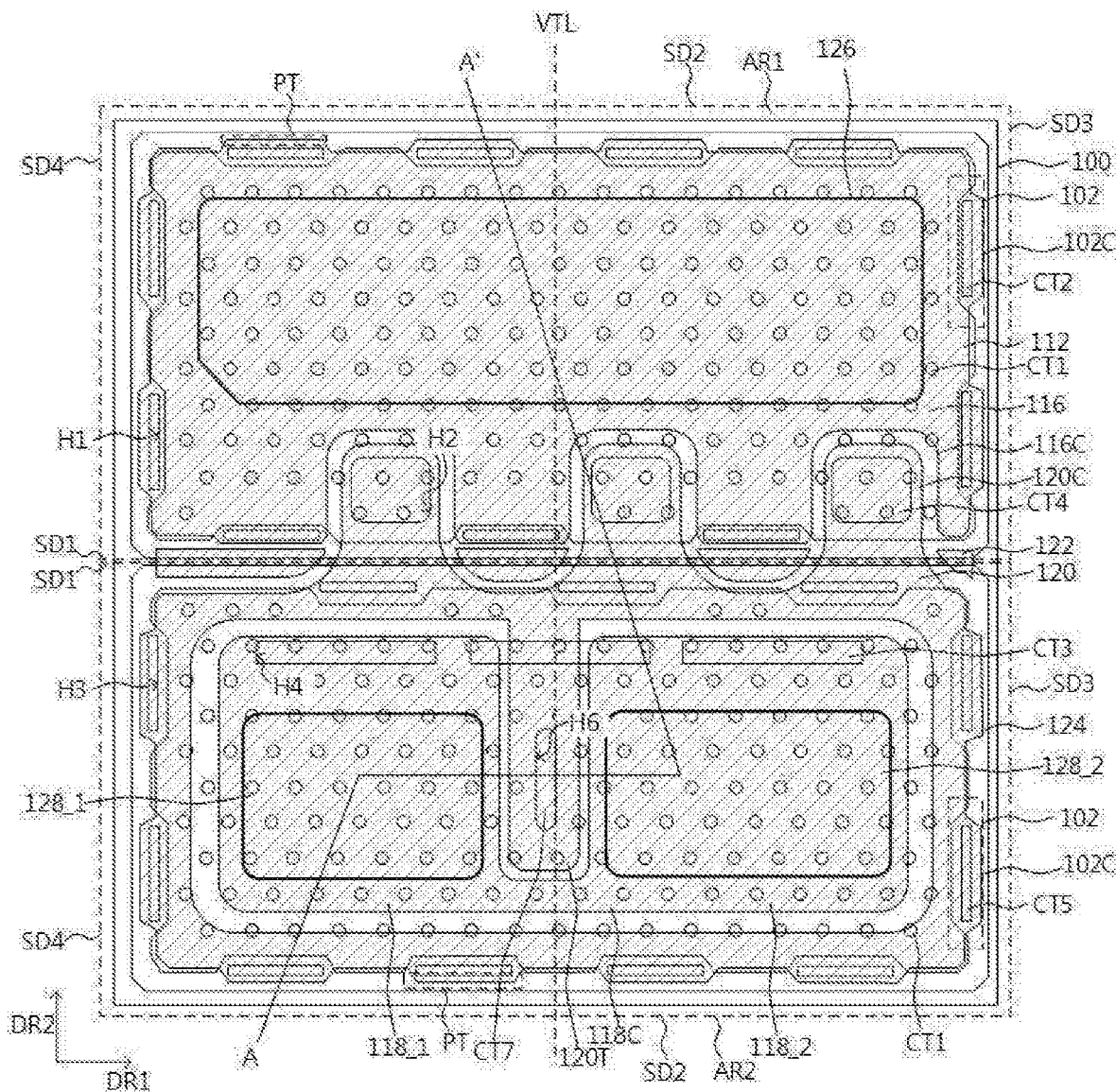
FIG. 2A is a plan view of a light emitting device according to yet another exemplary embodiment of the present disclosure.
Figure 2B:
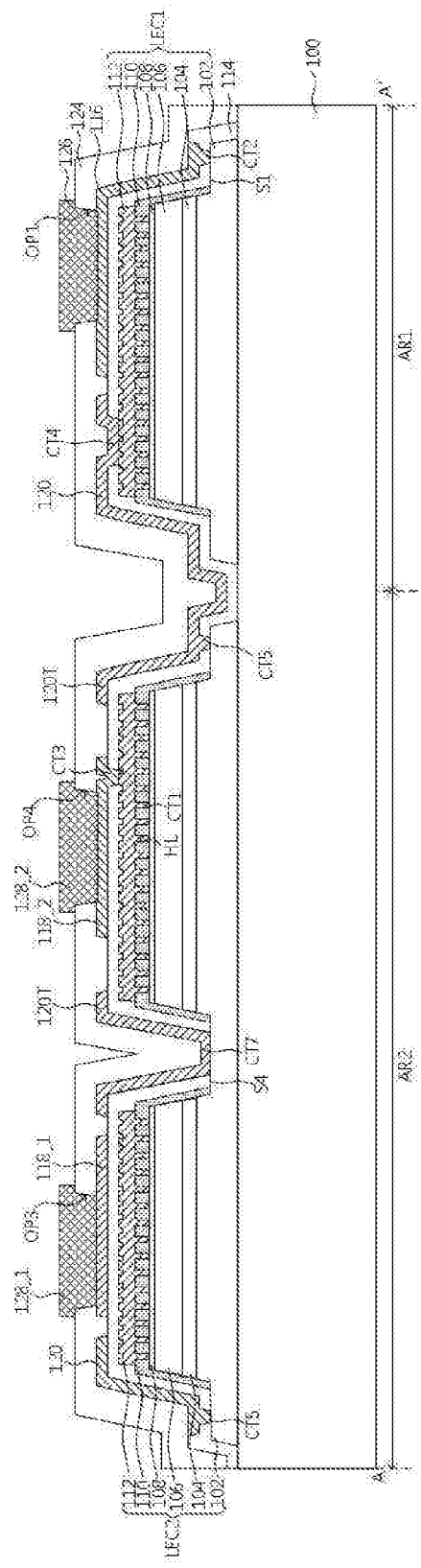
FIG. 2B is a cross-sectional view of the light emitting device taken along line A-A' in FIG. 2A.

FIG. 2A is a plan view of a light emitting device according to yet another exemplary embodiment of the present disclosure and FIG. 2B is a cross-sectional view of the light emitting device taken along line A-A' in FIG. 2A.

Referring to FIG. 2A and FIG. 2B, the light emitting device may include a substrate 100, a plurality of light emitting cells LEC1, LEC2, a first passivation layer 114, a first conductive pattern 116, second conductive patterns 118_1, 118_2, 118C, a connection pattern 120, a floating pattern 122, a second passivation layer 124, a first electrode pad 126, and second electrode pads 128_1, 128_2.

The first light emitting cell LEC1 and the second light emitting cell LEC2 may be disposed on the substrate 100 to be spaced apart from each other. Each of the first light emitting cell LEC1 and the second light emitting cell LEC2 may include a first conductivity type semiconductor layer 102, an active layer 104, a second conductivity type semiconductor layer 106, an ohmic layer 108, an insulation layer 110, and a reflective layer 112. The insulation layer 110 may include a plurality of holes. In addition, the reflective layer 112 may include first contact portions CT1, which fill the plurality of holes of the insulation layer 110.

According to one exemplary embodiment, the second light emitting cell LEC2 may have a first surface S1 formed by etching an edge thereof to expose the first conductivity type semiconductor layer 102 and a fourth surface S4 formed by partially etching a central region of the second light emitting cell LEC2 to expose the first conductivity type semiconductor layer 102. The first surface S1 and the fourth surface S4 may be coplanar with each other.

The first passivation layer 114 may include first holes H1 which expose the first conductivity type semiconductor layer 102 of the first surface S1 in the first region AR1; second holes H2 which are disposed adjacent to the first side surface SD1 of the first region AR1 and expose the reflective layer 112; third holes H3 which expose the first conductivity type semiconductor layer 102 of the first surface S1 in the second region AR2; fourth holes H4 which expose the reflective layer 112 of the second region AR2; and a sixth hole H6 which exposes the first conductivity type semiconductor layer 102 of the fourth surface S4 at the center of the first region AR1.

The first conductive pattern 116, the second conductive patterns 118_1, 118_2, 118C, and the connection pattern 120 may be disposed on the first passivation layer 114.

The first conductive pattern 116 may include second contact portions CT2, which fill the first holes H1 of the first passivation layer 114 and electrically contact the first conductivity type semiconductor layer 102, in the first region AR1.

The second conductive patterns 118_1, 118_2, 118C may include third contact portions CT3, which fill the fourth holes H4 of the first passivation layer 114 and electrically contact the reflective layer 112, in the second region AR2. According to one exemplary embodiment, the second conductive patterns 118_1, 118_2, 118C do not cover the sixth hole H6 and may be spaced apart from the sixth hole H6. By way of example, the second conductive patterns 118_1, 118_2, 118C may include a first pattern portion 118_1 and a second pattern portion 118_2 disposed at both sides with respect to the sixth hole H6 and a connecting portion 118C connecting the first pattern portion 118_1 to the second pattern portion 118_2 in plan view. Each of the first pattern portion 118_1 and the second pattern portion 118_2 may electrically contact the third contact portions CT3.

The connection pattern 120 may include fourth contact portions CT4 which fill the second holes H2 of the first passivation layer 114 and electrically contact the reflective layer 112 in the first region AR1; fifth contact portions CT5 which fill the third holes H3 of the first passivation layer 114 and electrically contacting the first conductivity type semiconductor layer 102 in the second region AR2; and a seventh contact portion CT7 which fills the sixth hole H6 of the first passivation layer 114 and electrically contacts the first conductivity type semiconductor layer 102 in the second region AR2. According to one exemplary embodiment, the connection pattern 120 may have a rectangular ring structure surrounding the second conductive patterns 118_1, 118_2, 118C, and may include convex portions 120C extending from the second region AR2 toward the first region AR1 and electrically contacting the fourth contact portions CT4 and a protrusion 120T extending toward the second side surface SD2 of the second region AR2 and electrically contacting the seventh contact portion CT7. The protrusion 120T may be disposed between the first pattern portion 118_1 and the second pattern portion 118_2. The second conductive patterns 118_1, 118_2, 118C may be spaced apart from the protrusion 120T and may face each other.

The second passivation layer 124 may include a first opening OP1 exposing the first conductive pattern 116, a third opening OP3 exposing first pattern portion 118_1, and a fourth opening OP4 exposing the second pattern portion 118_2.

The first electrode pad 126 and the second electrode pads 128_1, 128_2 may be disposed on the second passivation layer 124.

The first electrode pad 126 may fill the first opening OP1 to be electrically connected to the first conductive pattern 116. The first electrode pad 126 may be electrically connected to the first conductivity type semiconductor layer 102 electrically contacting the second contact portions CT2 of the first conductive pattern 116.

The second electrode pads 128_1, 128_2 may fill the third opening OP3 and the fourth opening OP4 to be electrically connected to the first pattern portion 118_1 and the second pattern portion 118_2. Each of the second electrode pads 128_1, 128_2 may be electrically connected to the second conductivity type semiconductor layer 106, which electrically contacts the ohmic layer 108, through the reflective layer 112 electrically contacting the third contact portions CT3 of the second conductive patterns 118_1, 118_2, 118C.

The seventh contact portion CT7 may be electrically connected to the first conductivity type semiconductor layer 102 and the second electrode pads 128_1, 128_2 do not cover the protrusion 120T adjoining the seventh contact portion CT7 of the connection pattern 120, thereby preventing failure due to contact between the second electrode pads 128_1, 128_2 and the connection pattern 120 electrically contacting the seventh contact portion CT7 even in the case where the second passivation layer 124 is damaged and broken due to external particles.

Components of this exemplary embodiment denoted by the same reference numerals as the components described with reference to FIG. 1A through FIG. 1E are substantially the same as the components described with reference to these drawings, and detailed description thereof is omitted herein.

Next, a method of manufacturing the light emitting device shown in FIG. 1A and FIG. 1D will be described by way of example.

FIG. 3A to FIG. 9A are plan views illustrating a method of manufacturing the light emitting diode according to the one exemplary embodiment of the present disclosure, and FIG. 3B to FIG. 9B are cross-sectional views of the light emitting diode taken along line A-A' in FIG. 3A to FIG. 9A.

Figure 3A:
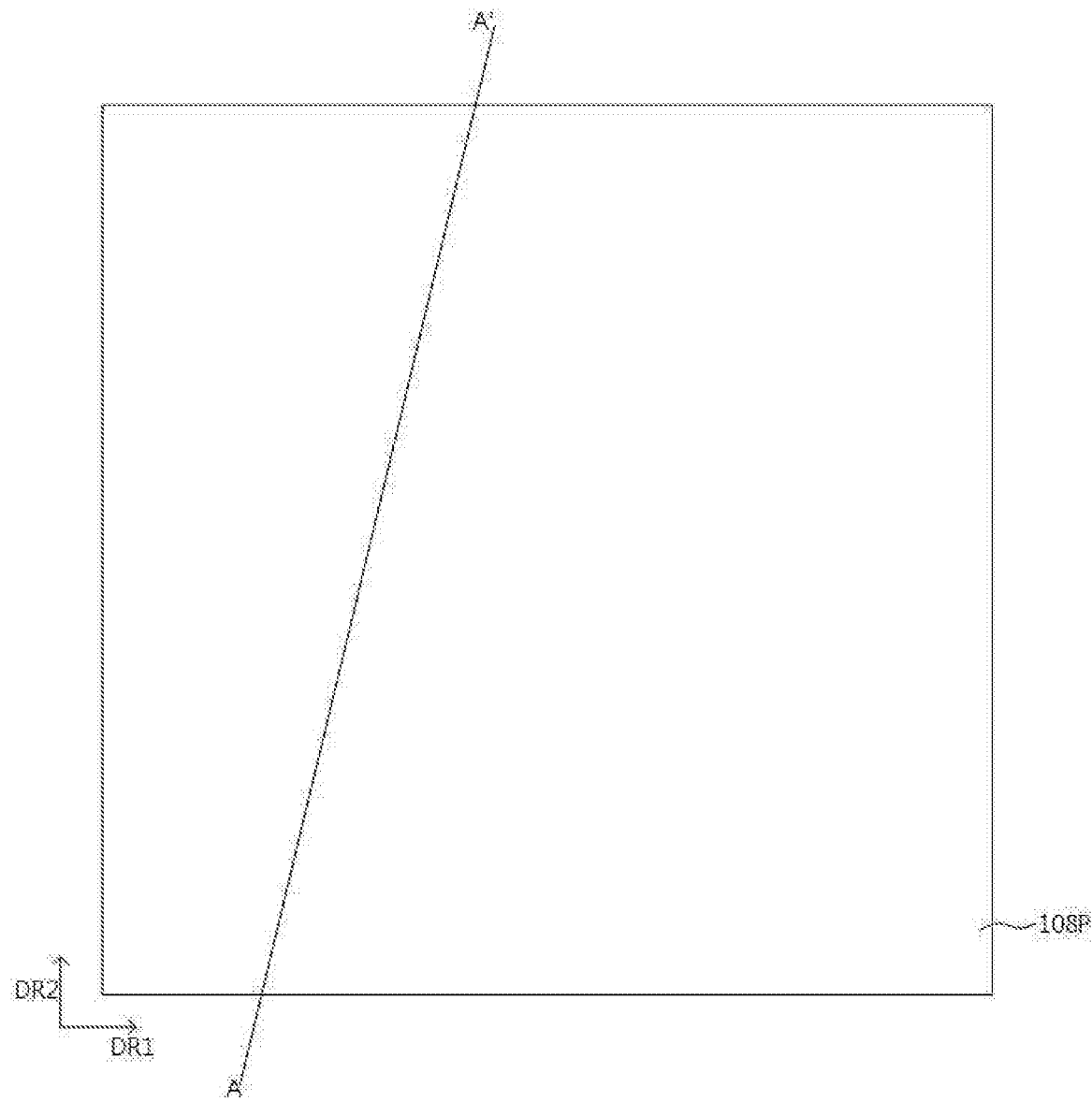
Figure 3B:
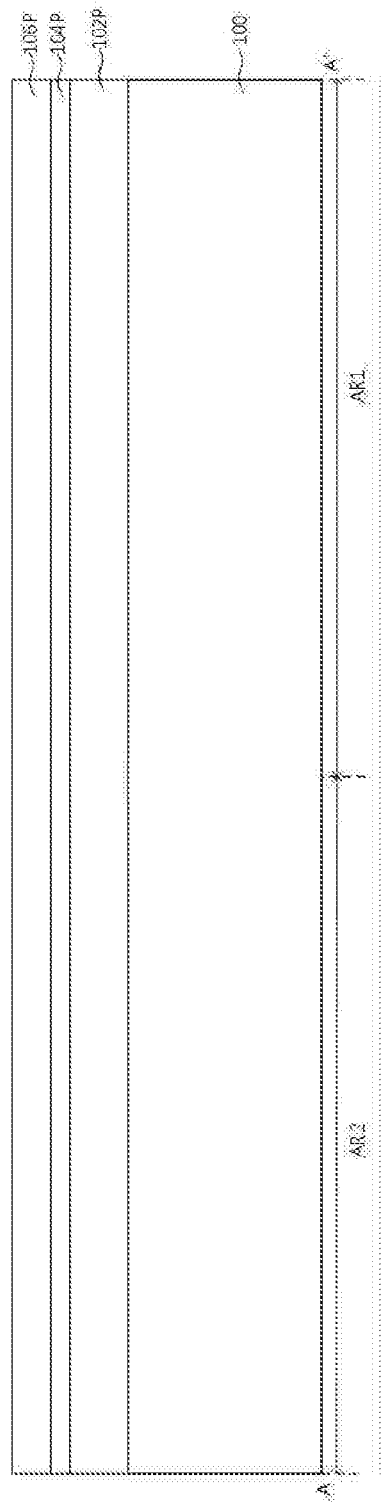

Referring to FIG. 3A and FIG. 3B, a preparatory first conductivity type semiconductor layer 102P, a preparatory active layer 104P, a preparatory second conductivity type semiconductor layer 106P and a preparatory ohmic layer 108P may be sequentially formed on a substrate 100.

The preparatory first conductivity type semiconductor layer 102P, the preparatory active layer 104P, and the preparatory second conductivity type semiconductor layer 106P may be sequentially grown on the substrate 100 through a process, such as metal organic chemical vapor deposition (MOCVD) or molecular beam epitaxy (MBE). Then, the preparatory ohmic layer 108P may be formed on the preparatory second conductivity type semiconductor layer 106P through chemical vapor deposition (CVD).

Figure 4A:
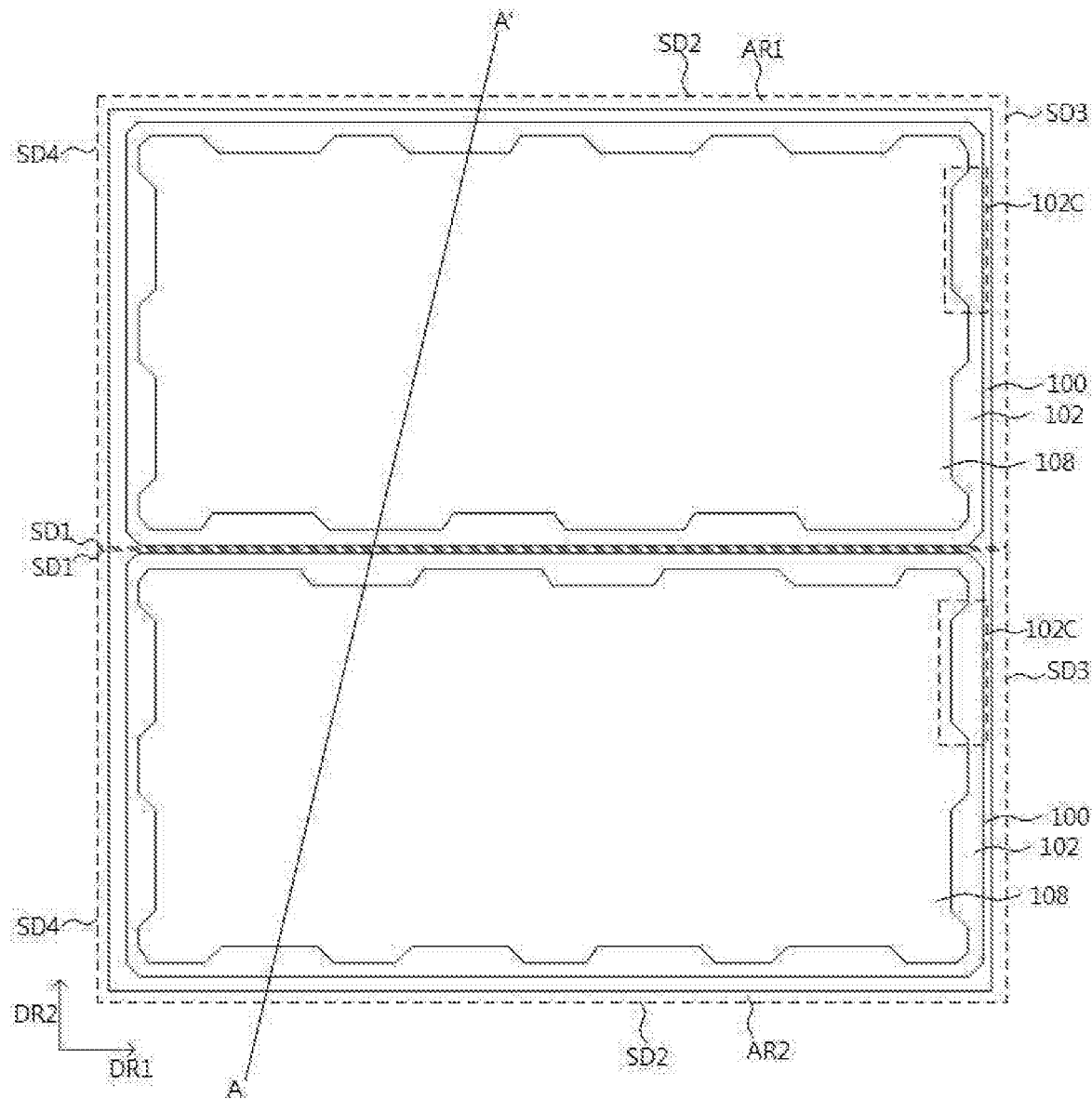
Figure 4B:
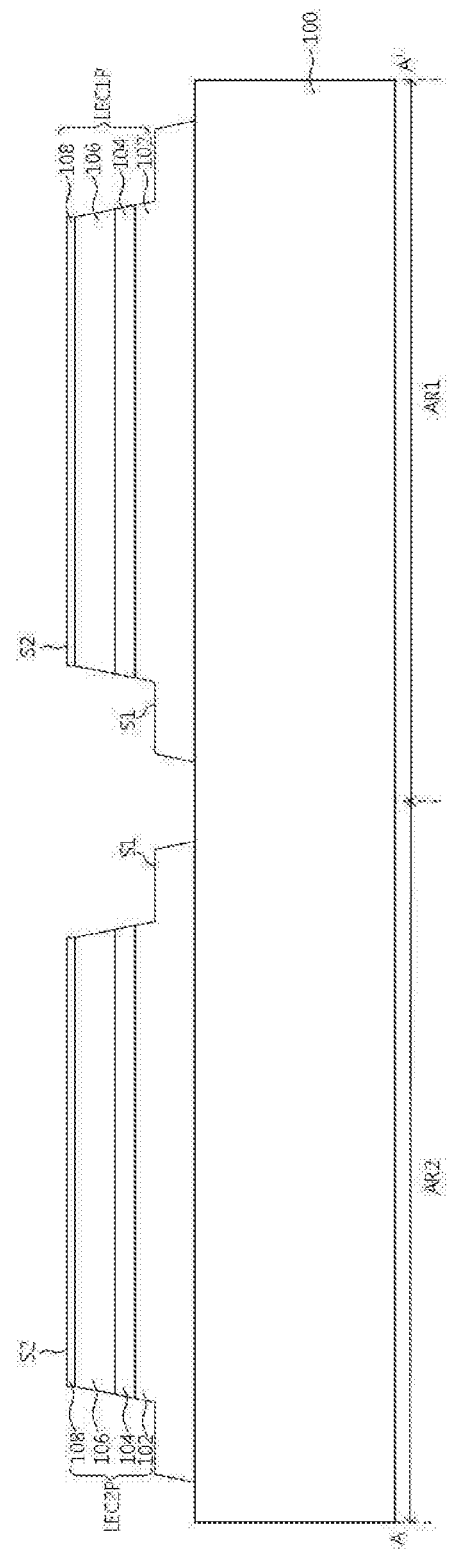

Referring to FIG. 4A and FIG. 4B, a preparatory first light emitting cell LEC1P and a preparatory second light emitting cell LEC2P may be formed by etching the preparatory ohmic layer 108P, the preparatory second conductivity type semiconductor layer 106P, the preparatory active layer 104P, and the preparatory first conductivity type semiconductor layer 102P.

Specifically, a first mask pattern (not shown) may be formed on the preparatory ohmic layer 108P, the preparatory second conductivity type semiconductor layer 106P, the preparatory active layer 104P, and the preparatory first conductivity type semiconductor layer 102P, followed by etching the preparatory ohmic layer 108P, the preparatory second conductivity type semiconductor layer 106P, the preparatory active layer 104P, and the preparatory first conductivity type semiconductor layer 102P using the first mask pattern as an etching mask so as to expose the substrate 100.

After the first mask pattern is removed and a second mask pattern (not shown) is formed on the etched preparatory ohmic layers 108P, the preparatory first light emitting cell LEC1P and the preparatory second light emitting cell LEC2P may be formed by etching the preparatory ohmic layers 108P, the preparatory second conductivity type semiconductor layers 106, and the preparatory active layers 104P, which have been etched to expose the first conductivity type semiconductor layers 102, using the second mask pattern as an etching mask. Each of the preparatory first light emitting cell LEC1P and the preparatory second light emitting cell LEC2P may include the first conductivity type semiconductor layer 102, the active layer 104, the second conductivity type semiconductor layer 106, and the ohmic layer 108.

Each of the preparatory first light emitting cell LEC1P and the preparatory second light emitting cell LEC2P may have a second surface S2 exposing the ohmic layer 108 and a first surface formed along an edge thereof to expose the first conductivity type semiconductor layer 102.

Each of the second surfaces S2 may include concave portions formed at an edge thereof and indented into each of the preparatory first light emitting cell LEC1P and the preparatory second light emitting cell LEC2P. The first conductivity type semiconductor layer 102 may include convex portions 102C exposed by the concave portions of the second surfaces S2.

According to one exemplary embodiment, the preparatory first light emitting cell LEC1P and the preparatory second light emitting cell LEC2P may be subjected to a reflow process to form a slanted sidewall on each of the preparatory first light emitting cell LEC1P and the preparatory second light emitting cell LEC2P.

After formation of the preparatory first light emitting cell LEC1P and the preparatory second light emitting cell LEC2P, the second mask pattern may be removed.

Figure 5A:
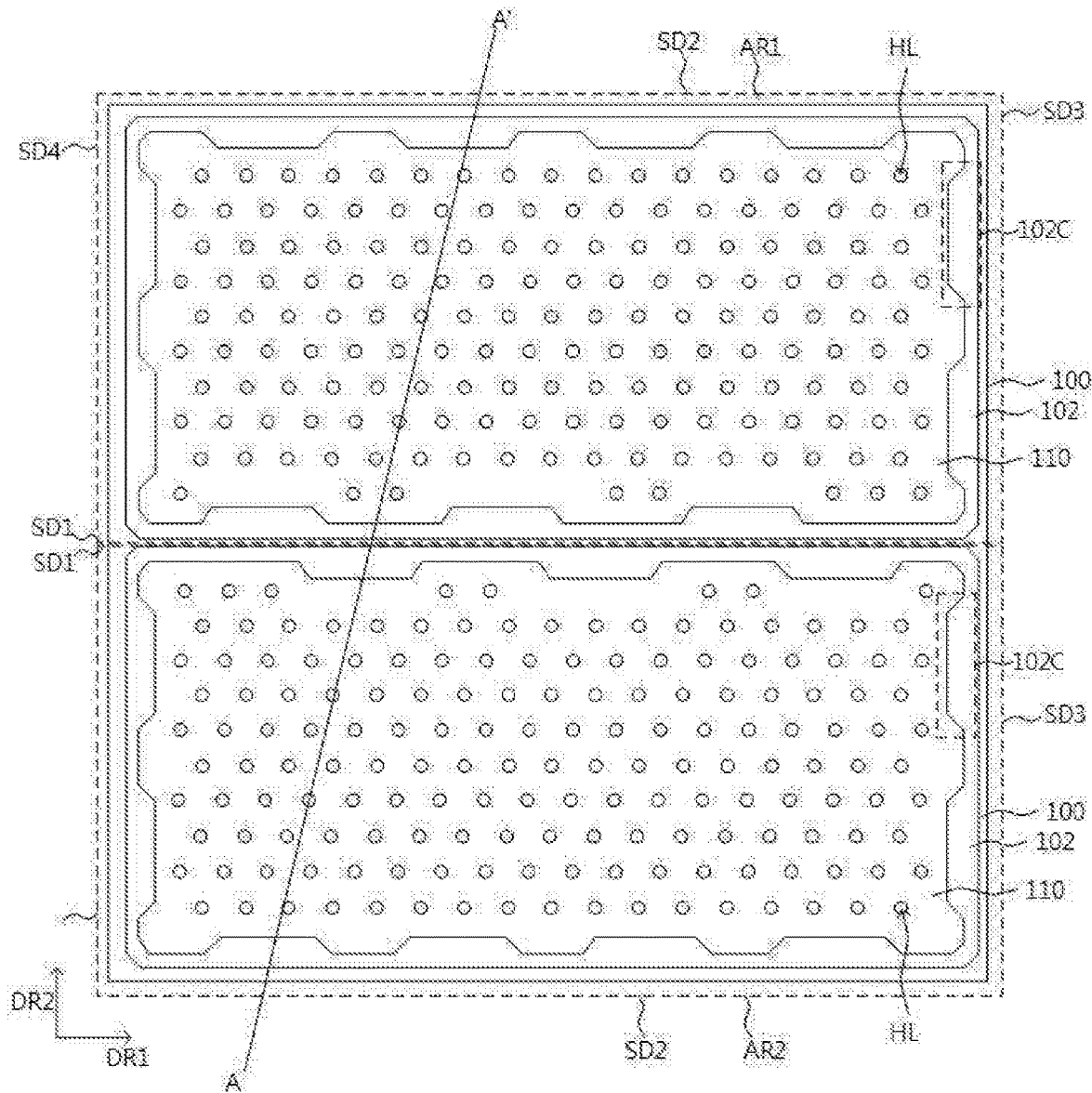
Figure 5B:
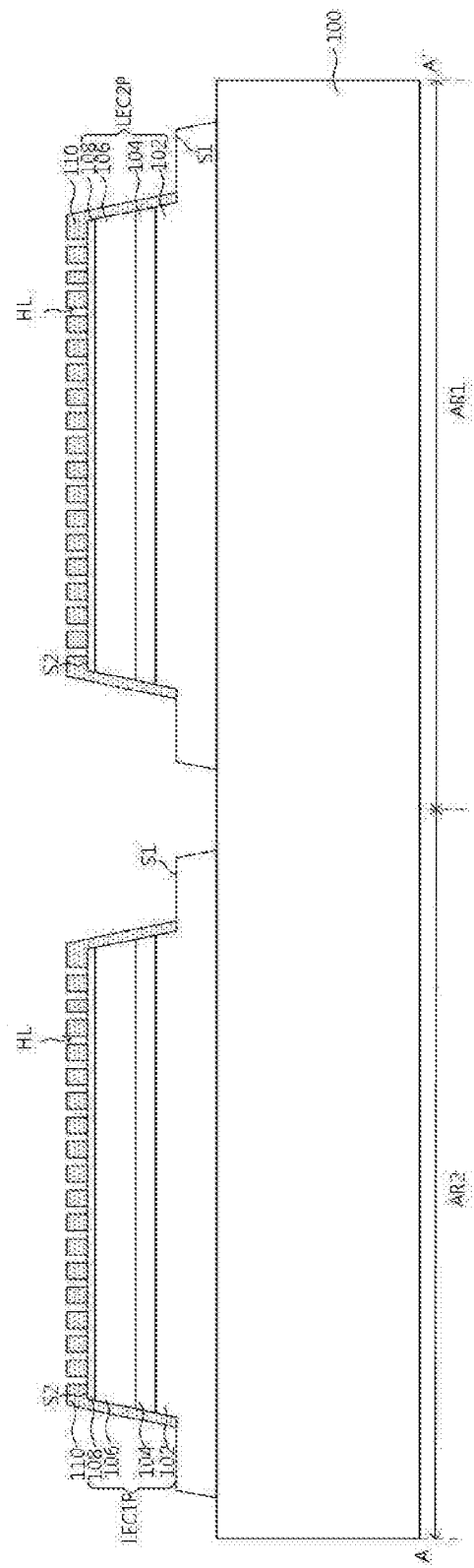

Referring to FIG. 5A and FIG. 5B, insulation layers 110 may be formed on the preparatory first light emitting cell LEC1P and the preparatory second light emitting cell LEC2P, respectively.

Specifically, a preparatory insulation layer (not shown) may be formed to a uniform thickness on the preparatory first light emitting cell LEC1P and the preparatory second light emitting cell LEC2P so as not to fill a gap between the preparatory first light emitting cell LEC1P and the preparatory second light emitting cell LEC2P. The insulation layers 110 may be formed to have a plurality of holes HL by forming a third mask pattern (not shown) on the preparatory insulation layer. The plurality of holes HL may be arranged at constant intervals and may be regularly and uniformly formed. After formation of the insulation layers 110, the third mask pattern may be removed.

According to one exemplary embodiment, each of the insulation layers 110 may be formed only on an upper surface of the ohmic layer 108. According to another exemplary embodiment, each of the insulation layers 110 may be formed on the upper surface of the ohmic layer 108 and may extend from the upper surface of the ohmic layer 108 to a side surface of each of the preparatory first light emitting cell LEC1P and the preparatory second light emitting cell LEC2P.

After formation of the insulation layers 110, the third mask pattern may be removed.

Figure 6A:
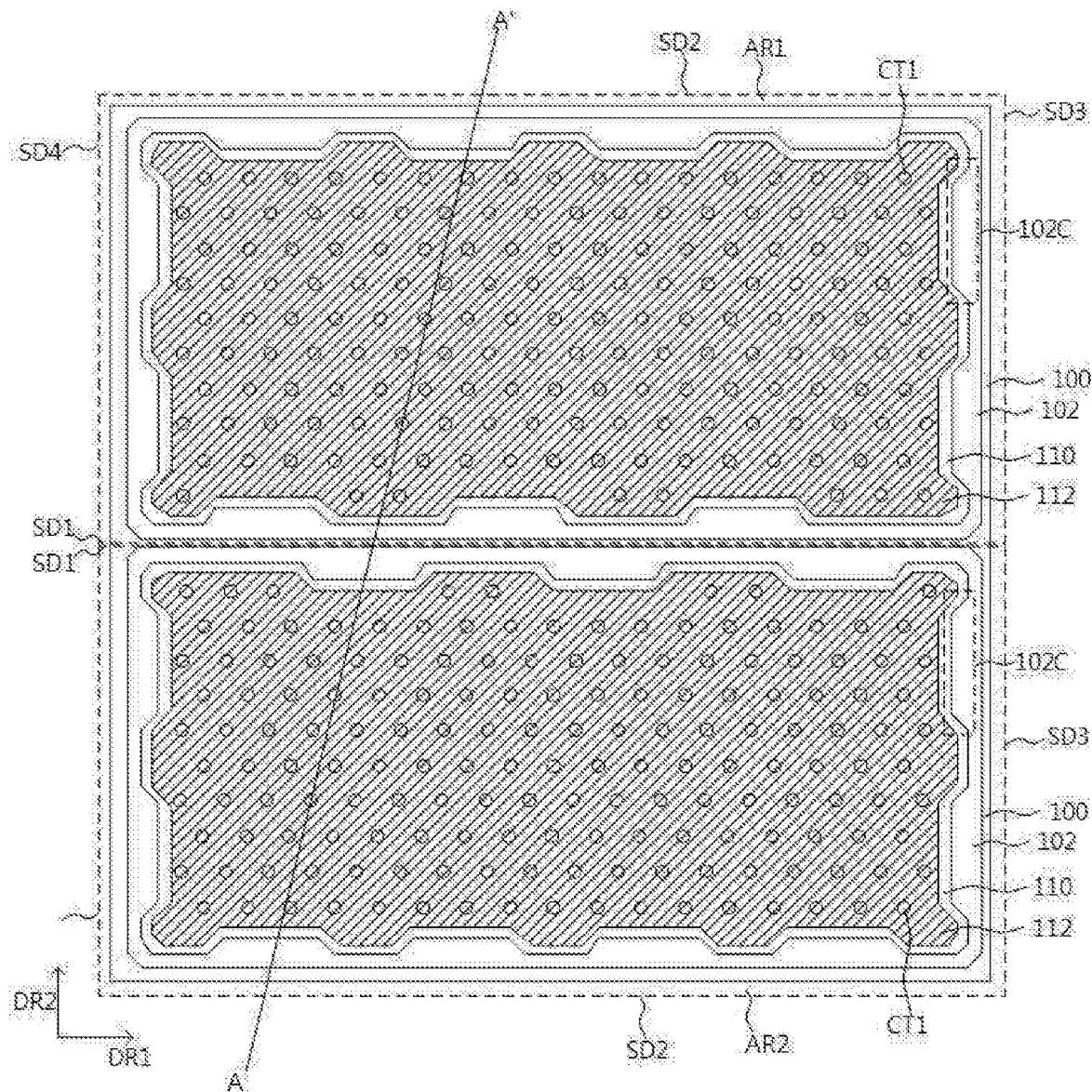
Figure 6B:
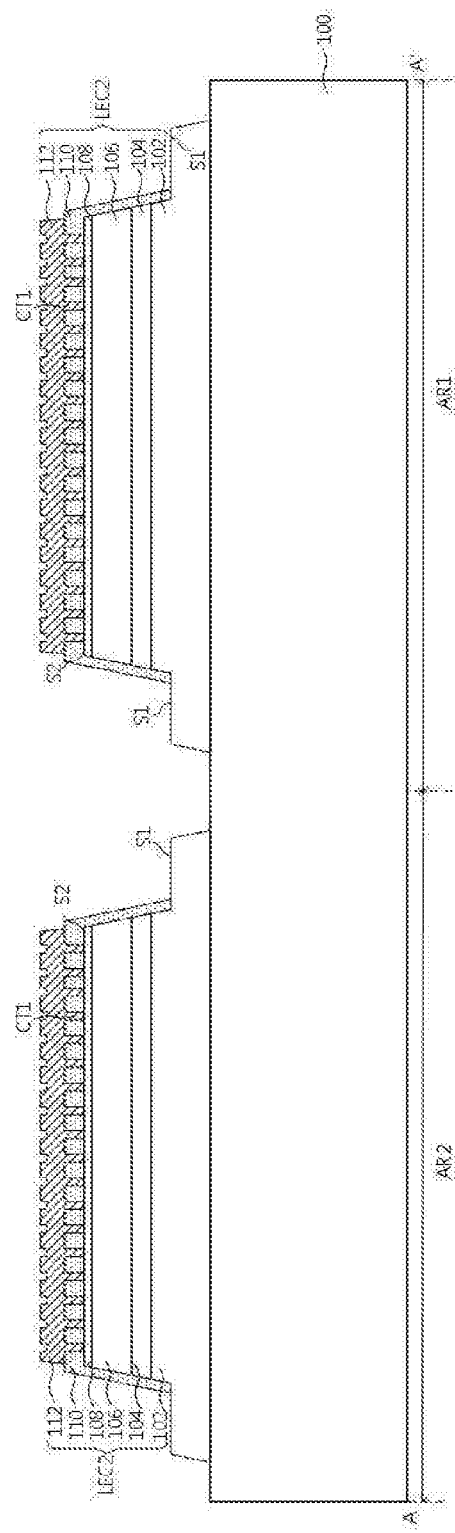

Referring to FIG. 6A and FIG. 6B, reflective layers 112 may be formed on the insulation layers 110 to form the first light emitting cell LEC1 and the second light emitting cell LEC2, respectively. Each of the first light emitting cell LEC1 and the second light emitting cell LEC2 may include the first conductivity type semiconductor layer 102, the active layer 104, the second conductivity type semiconductor layer 106, the ohmic layer 108, the insulation layer 110, and the reflective layer 112.

More specifically, a preparatory reflective layer (not shown) may be formed to a uniform thickness on the insulation layers 110 having the plurality of holes HL formed thereon so as not to fill the gap between the preparatory first light emitting cell LEC1P and the preparatory second light emitting cell LEC2P while filling the plurality of holes HL. After formation of a fourth mask layer (not shown) on the preparatory reflective layer, the reflective layers 112 may be formed by etching the preparatory reflective layer using the fourth mask pattern as an etching mask.

Each of the reflective layers 112 may include first contact portions CT1 which fill the plurality of holes HL of the insulation layer 110. After formation of the reflective layers 112, the fourth mask pattern may be removed.

Figure 7A:
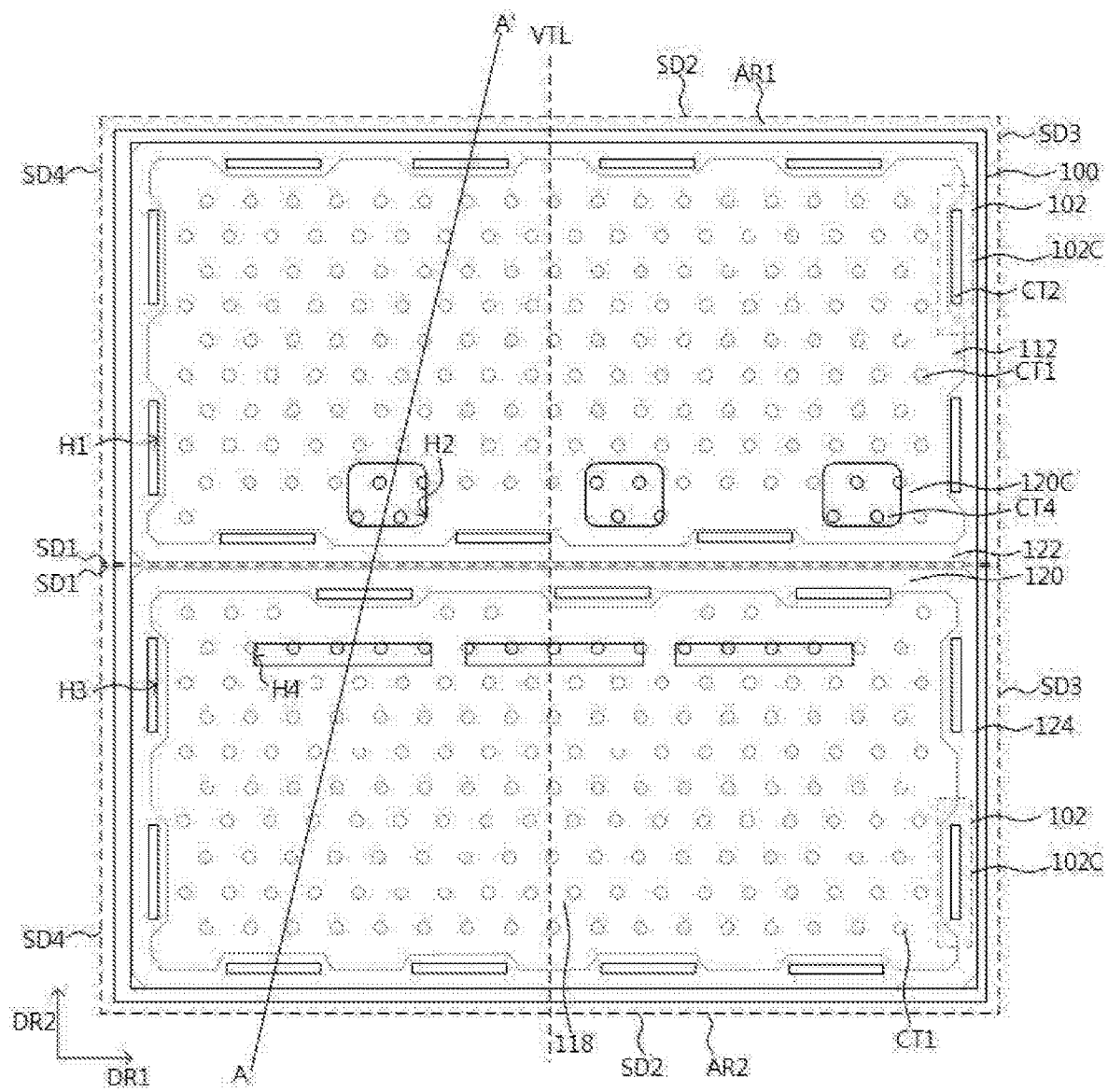
Figure 7B:
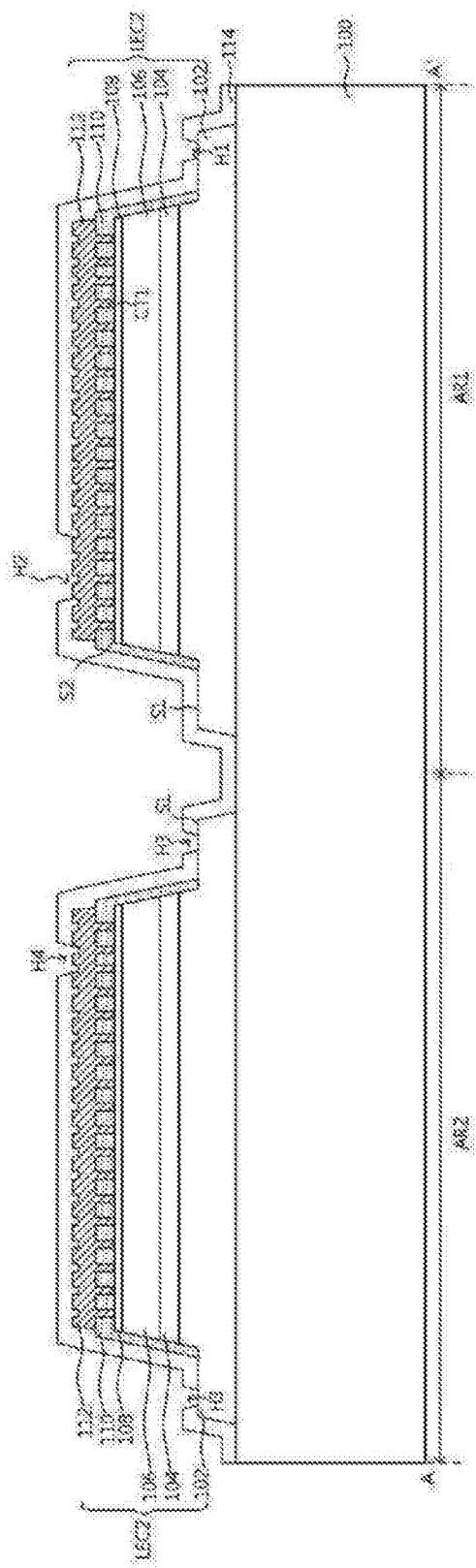

Referring to FIG. 7A and FIG. 7B, a preparatory first passivation layer (not shown) is formed to a uniform thickness on the first light emitting cell LEC1 and the second light emitting cell LEC2 so as not to fill the gap between the first light emitting cell LEC1 and the second light emitting cell LEC2. After formation of a fifth mask pattern (not shown), the preparatory first passivation layer is subjected to patterning using the fifth mask pattern as an etching mask to form a first passivation layer 114, which has first holes H1 exposing the first conductivity type semiconductor layer 102 in the first region AR1, second holes H2 exposing the reflective layer 112 in the first region AR1, third holes H3 exposing the first conductivity type semiconductor layer 102 in the second region AR2, and fourth holes H4 exposing the reflective layer 112 in the second region AR2. After formation of the first passivation layer 114, the fifth mask pattern may be removed.

The first holes H1 may expose the convex portions 102C in the first region AR1, respectively. In plan view, the first holes H1 disposed adjacent to the first side surface SD1 and the second side surface SD2 in the first region AR1 may have a rectangular structure extending in the first direction DR1, and the first holes H1 disposed adjacent to the third side surface SD3 and the fourth side surface SD4 in the first region AR1 may have a rectangular structure extending in the second direction DR2. According to one exemplary embodiment, the first holes H1 may have substantially the same size and structure. In this case, the number of first holes H1 disposed adjacent to the first side surface SD1 in the first region AR1 may be smaller than the number of first holes H1 disposed adjacent to the second side surface SD2 in the first region AR1. Particularly, the first holes H1 disposed adjacent to the first side surface SD1 in the first region AR1 may be biased to one side. By way of example, when three first holes H1 are formed, the center of the first hole H1 placed at the middle among the three first holes may be biased to one side with respect to an imaginary vertical line crossing the center of the substrate.

The second holes H2 may be disposed adjacent to the first side surface SD1 in the first region AR1. According to one exemplary embodiment, one first hole H1 may be disposed between two adjacent second holes H2. In addition, the second hole H2 may be biased to the other side. By way of example, when three second holes H2 are formed, the center of the second hole H2 placed at the middle among the three second holes may be biased to the other side with respect to the imaginary vertical line crossing the center of the substrate.

The third holes H3 may expose the convex portions 102C on the first surface S1 of the second light emitting cell LEC2, respectively. In plan view, the third holes H3 disposed adjacent to the first side surface SD1 and the second side surface SD2 in the second region AR2 may have a rectangular structure extending in the first direction DR1, and the third holes H3 disposed adjacent to the third side surface SD3 and the fourth side surface SD4 in the second region AR1 may have a rectangular structure extending in the second direction DR2. According to one exemplary embodiment, the third holes H3 may have substantially the same size and structure. In this case, the number of third holes H3 disposed adjacent to the first side surface SD1 in the second region AR2 may be smaller than the number of third holes H3 disposed adjacent to the second side surface SD2 in the second region AR2. Particularly, the third holes H3 disposed adjacent to the first side surface SD1 in the second region AR2 may be biased to one side. By way of example, when three third holes H3 are formed, the center of the third holes H3 placed at the middle among the three third holes may be biased to the other side with respect to the imaginary vertical line crossing the center of the substrate.

The fourth holes H4 may be arranged at constant intervals. By way of example, each of the fourth holes H4 may have a rectangular structure extending in the first direction DR1 in plan view.

Figure 8A:
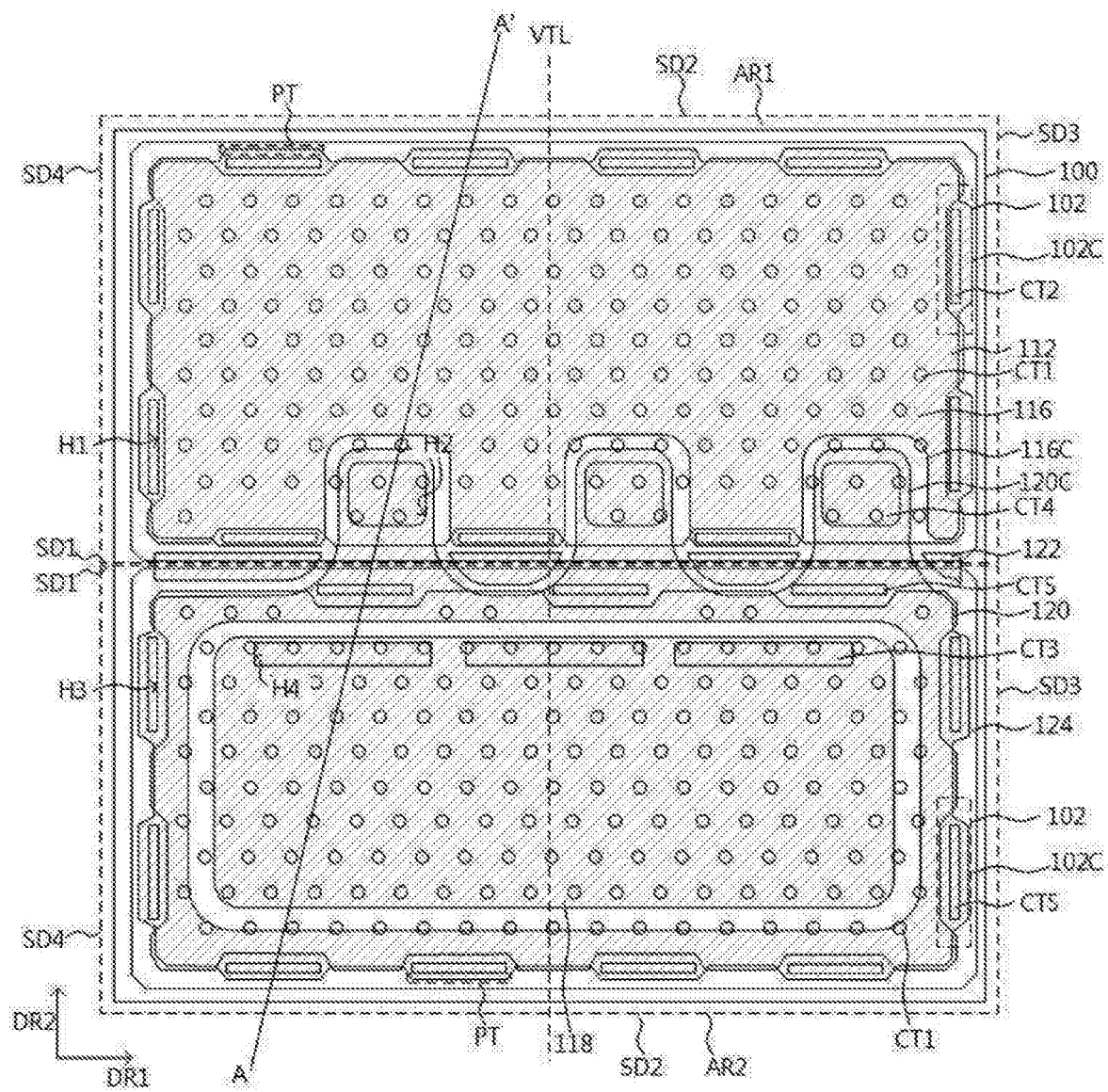
Figure 8B:
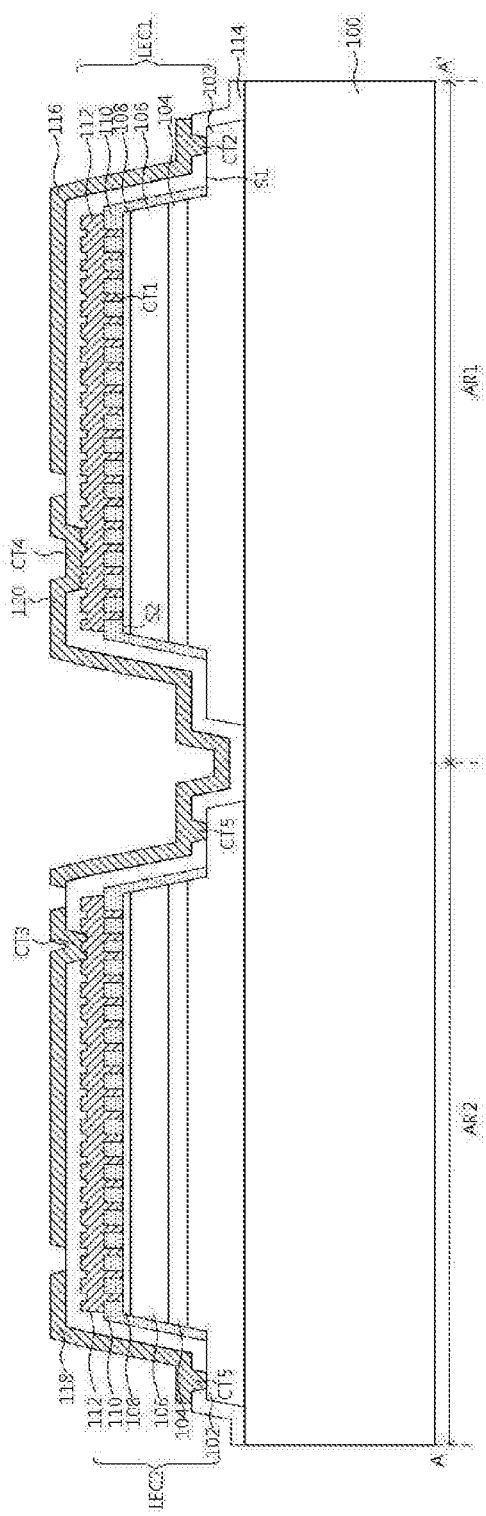

Referring to FIG. 8A and FIG. 8B, a first conductive pattern 116, a second conductive pattern 118, a connection pattern 120, and a floating pattern 122 may be formed on the first passivation layer 114.

Specifically, a conductive layer (not shown) may be formed to a uniform thickness on the first passivation layer 114 so as not to completely fill the gap between the first light emitting cell LEC1 and the second light emitting cell LEC2 on which the first passivation layer 114 is formed. After formation of a sixth mask pattern (not shown) on the conductive layer, the first conductive pattern 116, the second conductive pattern 118, the connection pattern 120, and the floating pattern 122 may be formed by patterning the conductive layer using the sixth mask pattern as an etching mask.

The first conductive pattern 116 may be formed in the first region AR1 and may include second contact portions CT2 filling the first holes H1 of the first passivation layer 114. The second contact portions CT2 may electrically contact the convex portions 102C of the first conductivity type semiconductor layer 102 exposed by the concave portions on the second surface S2 of the first light emitting cell LEC1, respectively. According to one exemplary embodiment, the first conductive pattern 116 may have a generally rectangular structure in plan view and may include concave portions 116C indented into the first light emitting cell LEC1 on the first side surface SD1 in the first region AR1. In addition, the first conductive pattern 116 may include protruding regions PT so as to completely cover the second contact portions CT2 and protruding outwards from portions of the first light emitting cell LEC1 at which the second contact portions CT2 are placed.

The second conductive pattern 118 may be formed in the second region AR2 and may include third contact portions CT3 filling the fourth holes H4 of the first passivation layer 114. Each of the third contact portions CT3 may electrically contact the reflective layer 112 exposed by the second surface S2 of the second light emitting cell LEC2. According to one exemplary embodiment, the second conductive pattern 118 may have a rectangular structure in plan view.

The connection pattern 120 may include fourth contact portions CT4 filling the second holes H2 of the first passivation layer 114 in the first region AR1, and fifth contact portions CT5 filling the third holes H3 of the first passivation layer 114 in the second region AR2. The fourth contact portions CT4 may electrically contact the reflective layer 112 of the first light emitting cell LEC1 and the fifth contact portions CT5 may electrically contact the first conductivity type semiconductor layer 102 of the second light emitting cell LEC2. According to one exemplary embodiment, the connection pattern 120 may have a rectangular ring structure surrounding the second conductive pattern 118 and may include convex portions 120C protruding from the first side surface SD1 of the second region AR2 toward the first region AR1. The convex portions 120C of the connection pattern 120 may be spaced apart from the concave portions 116C of the first conductive pattern 116 and face the concave portions 116C of the first conductive pattern 116, respectively.

The floating pattern 122 may be formed over the first region AR1 and the second region AR2 and may be disposed between the first conductive pattern 116 and the connection pattern 120. In plan view, one surface of the floating pattern 122 may correspond to the first conductive pattern and the other surface thereof may correspond to the connection pattern. The floating pattern 122 may be electrically insulated from the first conductive pattern 116, the second conductive pattern 118, and the connection pattern 120, and may also be electrically insulated from the first light emitting cell LEC1 and the second light emitting cell LEC2.

After formation of the first conductive pattern 116, the second conductive pattern 118, the connection pattern 120, and the floating pattern 122, the sixth mask pattern may be removed.

In this way, the floating pattern 122 is formed together with the first conductive pattern 116 and the second conductive pattern 118 during formation thereof, thereby enabling omission of a separate process for forming the floating pattern 122. As a result, the floating pattern 122 can be more easily formed and heat generated from the light emitting device can be effectively dissipated from the floating pattern 122.

Figure 9A:
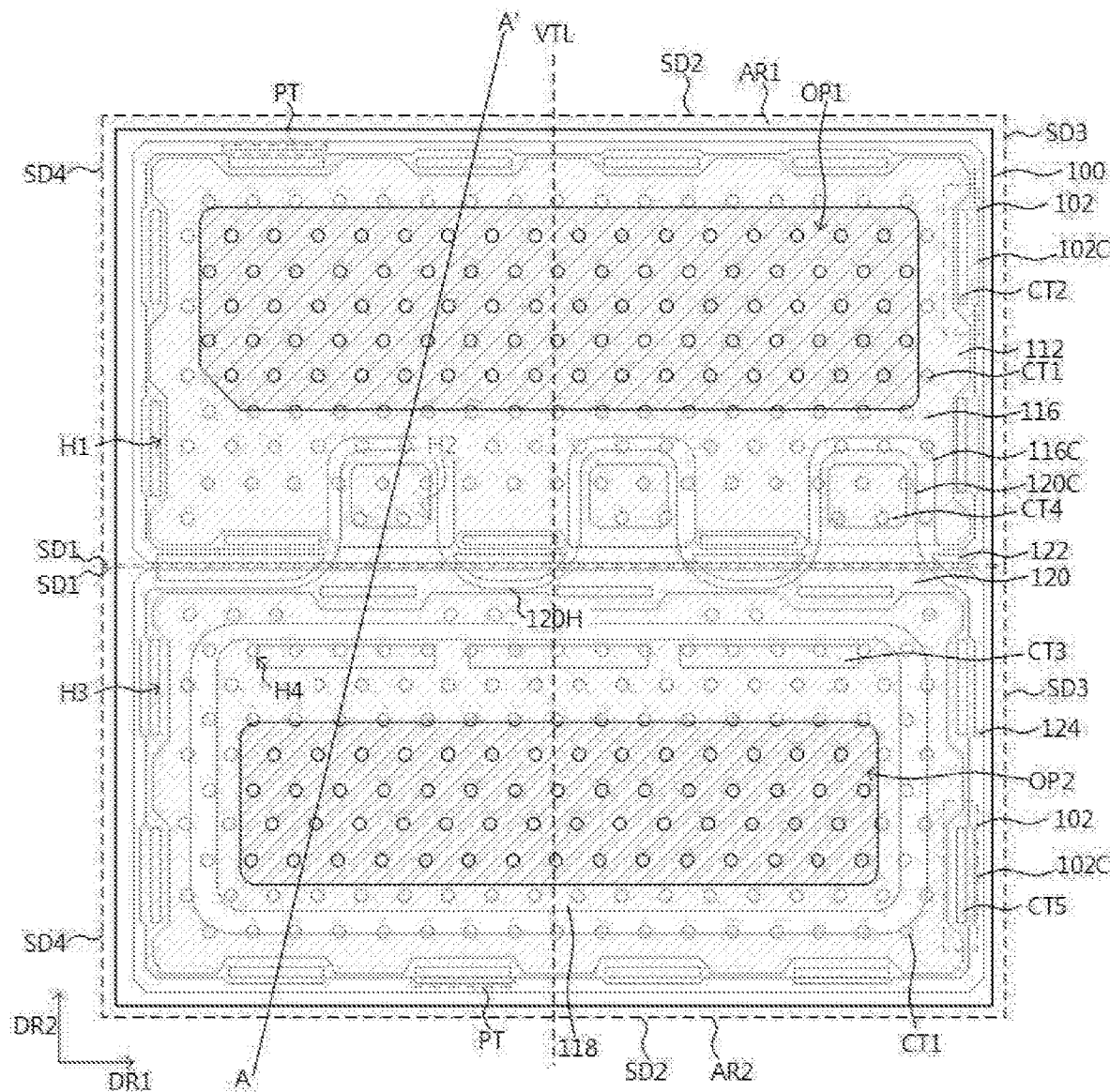
Figure 9B:
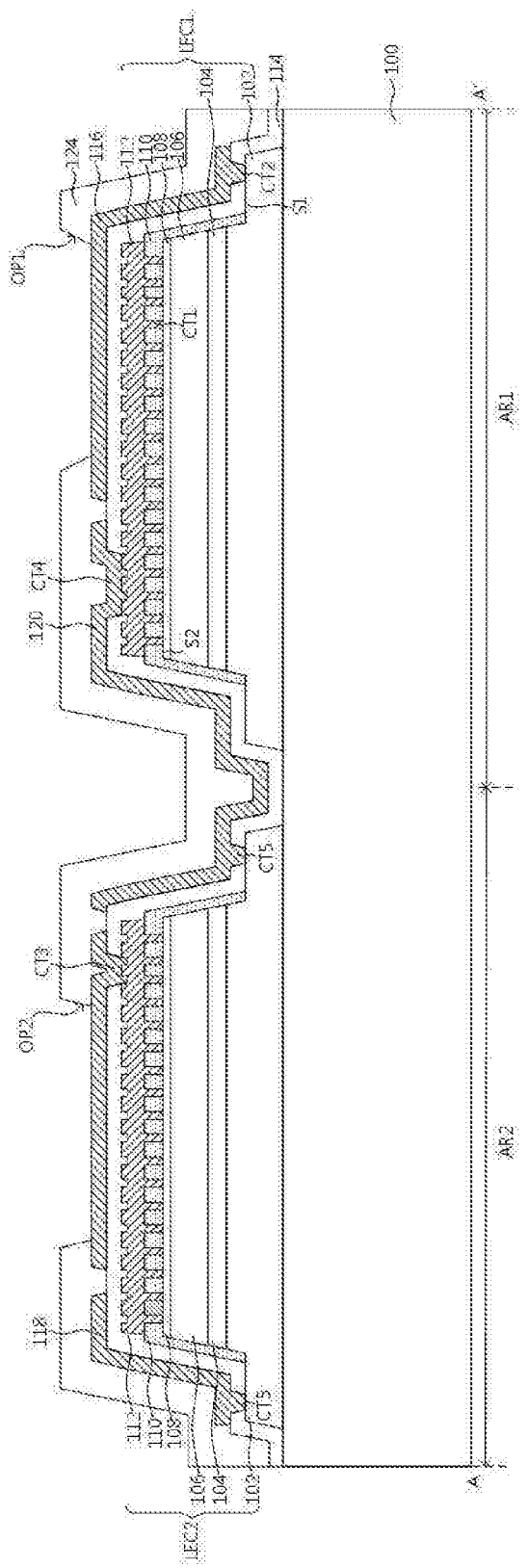

Referring to FIG. 9A and FIG. 9B, a preparatory second passivation layer (not shown) may be formed to a uniform thickness on the first conductive pattern 116, the second conductive pattern 118, the connection pattern 120, and the floating pattern 122 so as not to completely fill the gap between the first light emitting cell LEC1 and the second light emitting cell LEC2. After formation of a seventh mask pattern (not shown) on the preparatory second passivation layer 124, a second passivation layer 124 having a first opening OP1 and a second opening OP2 respectively exposing the first conductive pattern 116 and the second conductive pattern 118 is formed by etching the preparatory second passivation layer 124 using the seventh mask pattern as an etching mask.

Referring again to FIG. 1A and FIG. 1D, a first electrode pad 126 and a second electrode pad 128 may be formed on the second passivation layer 124.

Specifically, an electrode layer (not shown) may be formed to a uniform thickness on the second passivation layer 124 to fill the first opening OP1 and the second opening OP2. After formation of an eighth mask pattern (not shown) on the electrode layer, the electrode layer is subjected to patterning using the eighth mask pattern as an etching mask to form the first electrode pad 126 electrically connected to the first conductive pattern 116 exposed through the first opening OP1 and the second electrode pad 128 electrically connected to the second conductive pattern 118 exposed through the second opening OP2. After formation of the first electrode pad 126 and the second electrode pad 128, the eighth mask pattern may be removed.

Figure 10A:
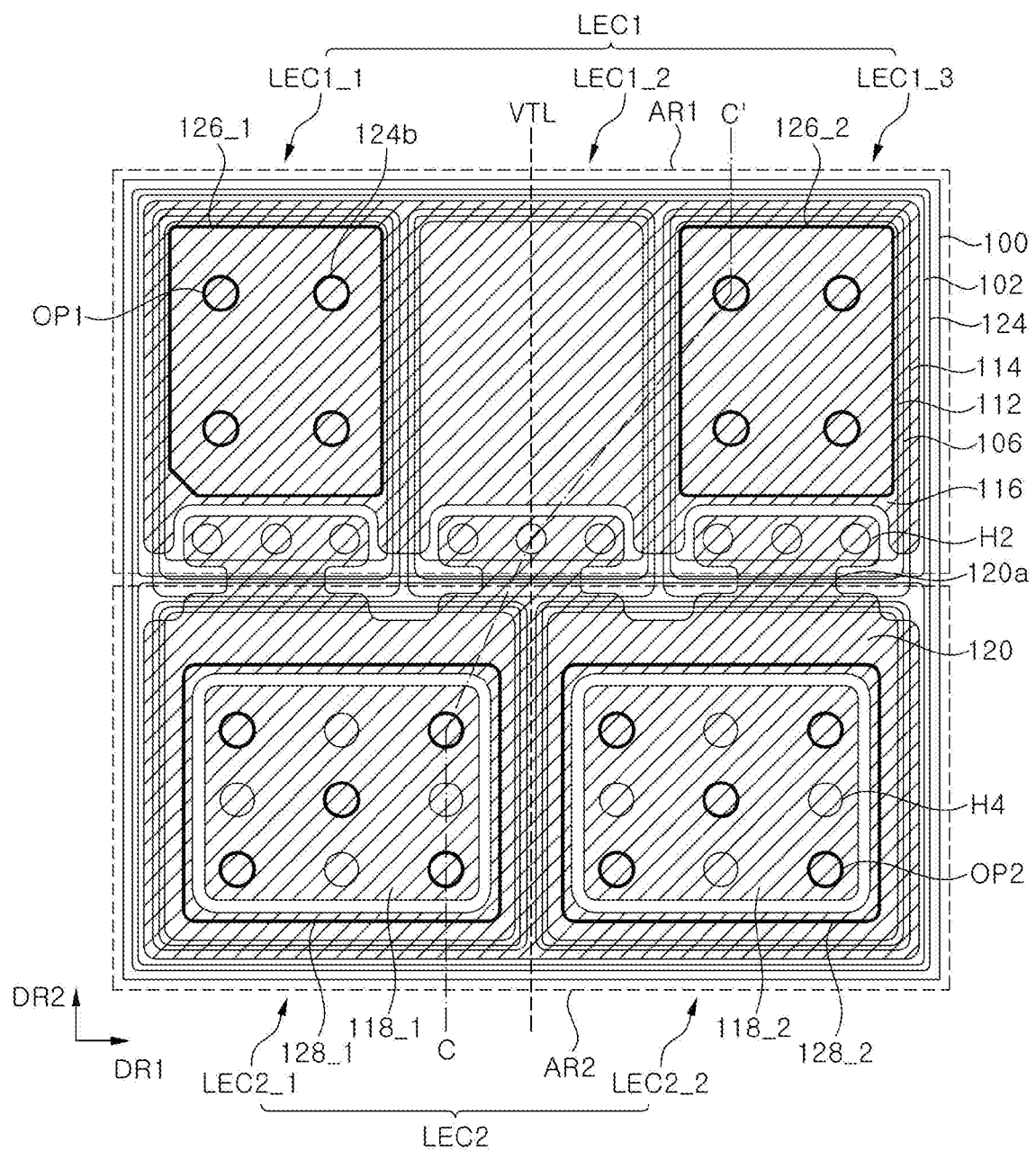
FIG. 10A is a plan view of a light emitting device according to yet another exemplary embodiment of the present disclosure.
Figure 10B:
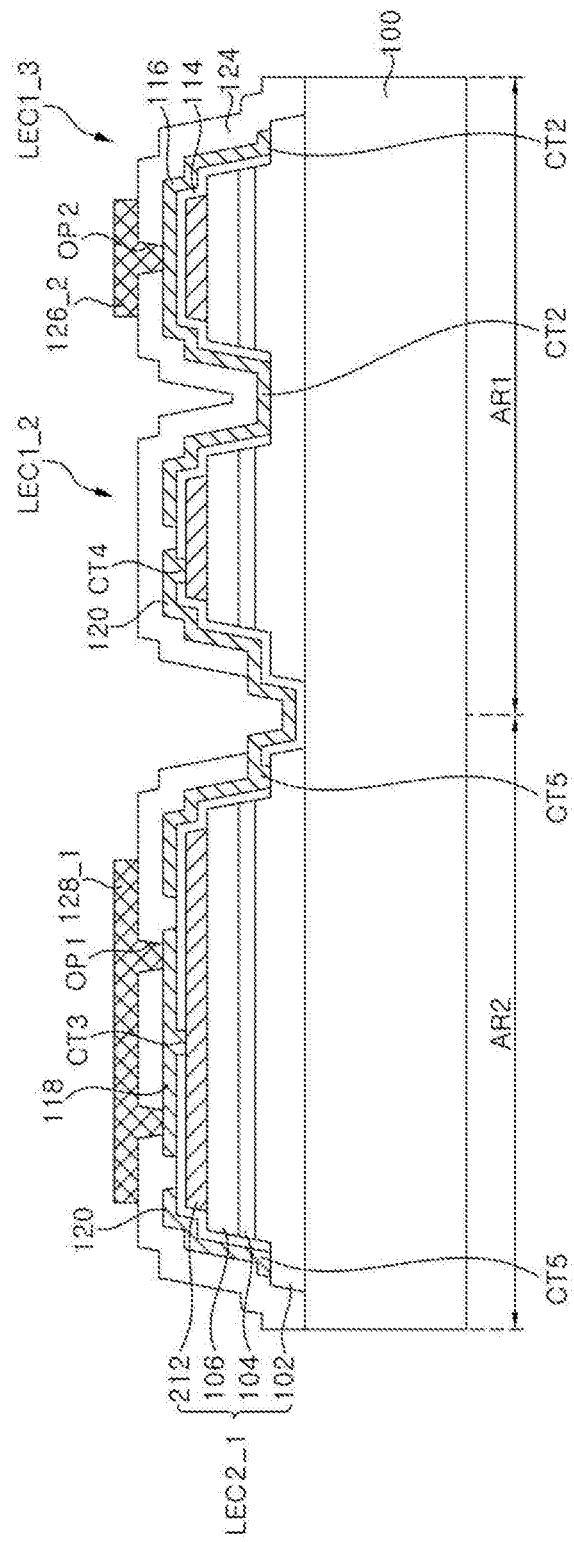
FIG. 10B is a cross-sectional view of the light emitting device taken along line C-C' in FIG. 10A.

FIG. 10A is a plan view of a light emitting device according to yet another exemplary embodiment of the present disclosure and FIG. 10B is a cross-sectional view of the light emitting device taken along line C-C' in FIG. 10A.

Referring to FIG. 10A and FIG. 10B, the light emitting device according to this embodiment may include a substrate 100, a plurality of light emitting cells LEC1, LEC2, a first passivation layer 114, a first conductive pattern 116, second conductive patterns 118_1, 118_2, a connection pattern 120, a second passivation layer 124, first electrode pads 126_1, 126_2, and second electrode pads 128_1, 128_2.

The first light emitting cell LEC1 and the second light emitting cell LEC2 are disposed on the substrate 100 to be spaced apart from each other. Each of the first light emitting cell LEC1 and the second light emitting cell LEC2 may include a first conductivity type semiconductor layer 102, an active layer 104, a second conductivity type semiconductor layer 106, and an ohmic reflective layer 212. The first light emitting cell LEC1 may be divided into a plurality of light emitting cells LEC1_1, LEC1_2, LEC1_3 sharing the first conductivity type semiconductor layer 102, and the second light emitting cell LEC2 may also be divided into a plurality of light emitting cells LEC2_1, LEC2_2 sharing the first conductivity type semiconductor layer 102.

The plural light emitting cells LEC1_1, LEC1_2, LEC1_3 share the first conductivity type semiconductor layer 102 and each may include the active layer 104, the second conductivity type semiconductor layer 106, and the ohmic reflective layer 212. Accordingly, the first conductivity type semiconductor layer 102 is exposed in regions between the light emitting cells LEC1_1, LEC1_2, LEC1_3. Furthermore, the first conductivity type semiconductor layer 102 may be exposed in a region around the light emitting cells LEC1_1, LEC1_2, LEC1_3.

Further, the plural light emitting cells LEC2_1, LEC2_2 share the first conductivity type semiconductor layer 102 and each may include the active layer 104, the second conductivity type semiconductor layer 106, and the ohmic reflective layer 212. Accordingly, the first conductivity type semiconductor layer 102 is exposed in regions between the light emitting cells LEC2_1, LEC2_2. Furthermore, the first conductivity type semiconductor layer 102 may be exposed in a region around light emitting cells LEC2_1, LEC2_2.

The ohmic reflective layer 212 may include an ohmic metal layer and a reflective metal layer, and may include, for example, Al. Al exhibits both ohmic characteristics and reflective characteristics, and thus may directly contact the second conductivity type semiconductor layer 106. Alternatively, an ohmic metal layer such as Cr or Ti may be formed and a reflective metal layer such as Ag or Al may be formed thereon.

Although the ohmic reflective layer 212 is illustrated as forming ohmic contact with the second conductivity type semiconductor layer 106 in this exemplary embodiment, it should be understood that the present disclosure is not limited thereto. As in the exemplary embodiment described above, the ohmic layer 108, the insulation layer 110 and the reflective layer 112 may be formed instead of the ohmic reflective layer 212.

The first passivation layer 114 includes second holes H2 exposing the ohmic reflective layer 212 in the first region AR1 and fourth holes H4 exposing the ohmic reflective layer 212 in the second region AR2, and exposes the first conductivity type semiconductor layer 102 in the first region AR1 and the first conductivity type semiconductor layer 102 in the second region AR2.

The second holes H2 are disposed on the plural light emitting cells LEC1-1, LEC1-2, LEC1-3 near a boundary region between the first light emitting cell LEC1 and the second light emitting cell LEC2, and the fourth holes H4 are disposed on the light emitting cells LEC2-1, LEC2-2.

The first passivation layer 114 may be formed in regions between the first light emitting cells LEC1-1, LEC1-2, LEC1-3 to expose the first conductivity type semiconductor layer 102. Furthermore, as shown in FIG. 10A, the first passivation layer 114 may expose the first conductivity type semiconductor layer 102 along the third side surface of each of the first light emitting cells LEC1-1, LEC1-2, LEC1-3 and may expose the first conductivity type semiconductor layer 102 along the fourth side surface of each of the second light emitting cells LEC2-1, LEC2-2.

Although the first passivation layer 114 is illustrated as consecutively exposing the first conductivity type semiconductor layer 102 along the side surface of each of the light emitting cells in this exemplary embodiment, it should be understood that the present disclosure is not limited thereto. For example, the first passivation layer 114 may include holes formed to expose the first conductivity type semiconductor layer 102 along the side surface of each of the light emitting cells.

The first conductive pattern 116, the second conductive patterns 118_1, 118_2, and the connection pattern 120 may be disposed on the first passivation layer 114.

The first conductive pattern 116 may include second contact portions CT2 electrically contacting the first conductivity type semiconductor layer 102 exposed through the first passivation layer 114 in the first region AR1. Particularly, the first conductive pattern 116 may include the second contact portions CT2 electrically contacting the first conductivity type semiconductor layer 102 along the third side surface of each of the light emitting cells LEC1_1, LEC1_2, LEC1_3.

As described above, the first conductive pattern 116 may include concave portions such that the convex portions of the connection pattern 120 may be disposed in the concave portions. Protrusions of the first conductive pattern 116 formed between the concave portions may contact the first conductivity type semiconductor layer 102 in regions between the light emitting cells LEC1_1, LEC1_2, LEC1_3.

The second conductive patterns 118_1, 118_2 may be disposed on the light emitting cells LEC2_1, LEC2_2 in the second region AR2, respectively, and may include third contact portions CT3 electrically contacting the ohmic reflective layer 212 through the fourth holes H4 of the first passivation layer 114. The second conductive patterns 118_1, 118_2 may be restrictively disposed on the light emitting cells LEC2_1, LEC2_2, respectively.

The connection pattern 120 may include fourth contact portions CT4, which fill the second holes H2 of the first passivation layer 114 and electrically contact the ohmic reflective layer 212, in the first region AR1, and fifth contact portions CT5, which electrically contact the first conductivity type semiconductor layer 102 exposed by the first passivation layer 114, in the second region AR2.

According to one exemplary embodiment, the connection pattern 120 may have a plurality of ring structures surrounding the second conductive patterns 118_1, 118_2 in plan view, and may include convex portions extending from the second region AR2 toward the first region AR1 and electrically contacting the fourth contact portions CT4, respectively.

The convex portions of the connection pattern 120 may include a neck 120a having a relatively narrow width, particularly in a cell isolation region between the first light emitting cell LEC1 and the second light emitting cell LEC2.

The second passivation layer 124 covers the first conductive pattern 116, the second conductive patterns 118_1, 118_2, and the connection pattern 120. Furthermore, the second passivation layer 124 may cover the substrate 100 around the light emitting cells LEC1, LEC2. On the other hand, the second passivation layer 124 may have first openings OP1 exposing the first conductive pattern 116 and second openings OP2 exposing the second conductive patterns 118_1, 118_2.

The first openings OP1 may be disposed on at least two light emitting cells LEC1_1, LEC1_3 among the light emitting cells LEC1_1, LEC1_2, LEC1_3, and the second openings OP2 may be disposed on at least two light emitting cells among the light emitting cells LEC2_1, LEC2_2.

The first openings OP1 and the second openings OP2 may be formed in a relatively large region as in the exemplary embodiments described above, and may be composed of a plurality of holes having a relatively small size as in this exemplary embodiment.

At least two first electrode pads 126_1, 126_2 and at least two second electrode pads 128_1, 128_2 may be disposed on the second passivation layer 124.

The first electrode pads 126_1, 126_2 may fill the first openings OP1 to be electrically connected to the first conductive pattern 116. The first electrode pad 126_1 may be restrictively disposed on the light emitting cell LEC1_1 and the first electrode pad 126_2 may be restrictively disposed on the light emitting cell LEC1_3. The first electrode pads 126_1, 126_2 are restrictively disposed on the light emitting cells LEC1_1, LEC1_3, respectively. Thus, the first electrode pads 126_1, 126_2 may have a relatively flat upper surface.

The first electrode pads 126_1, 126_2 may be electrically connected to the first conductivity type semiconductor layer 102 of the first light emitting cell LEC1 through the first conductive pattern 116.

The second electrode pads 128_1, 128_2 may fill the second openings OP2 to be electrically connected to the second conductive patterns 118_1, 118_2, respectively. In addition, the second electrode pads 128_1, 128_2 may be restrictively disposed on light emitting cells LEC2_1, LEC2_2, respectively. Thus, the second electrode pads 128_1, 128_2 may have a relatively flat upper surface.

The second electrode pads 128_1, 128_2 may be electrically connected to the second conductivity type semiconductor layer 106 of light emitting cells LEC2_1, LEC2_2 through the second conductive patterns 118_1, 118_2 and the ohmic reflective layer 212, respectively.

Components of this exemplary embodiment denoted by the same reference numerals as the components described with reference to FIG. 1A to FIG. 1E or FIG. 2A and FIG. 2B are substantially the same as the components described with reference to these drawings, and detailed description thereof is omitted herein.

Figure 11:
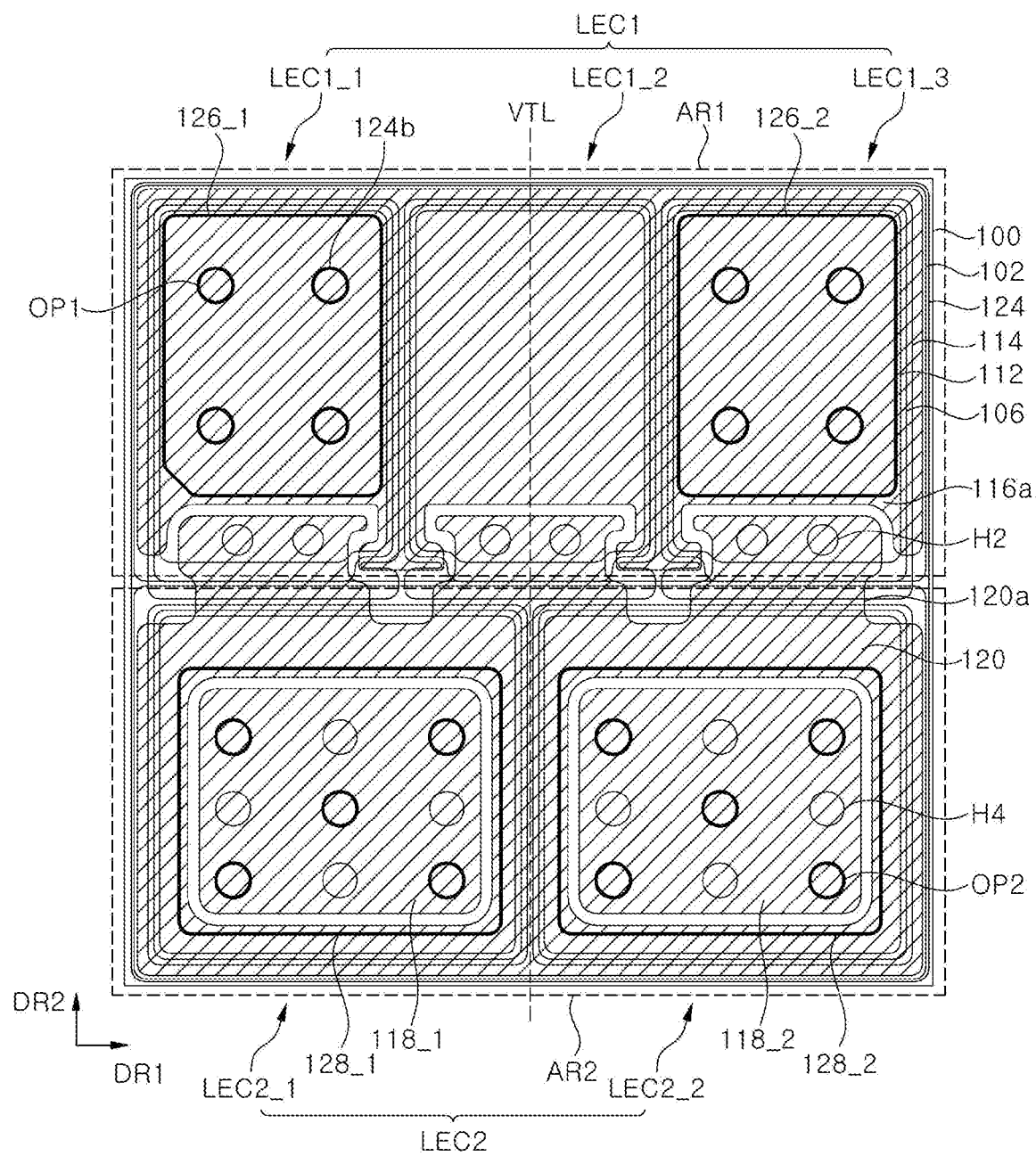
FIG. 11 is a plan view of a light emitting device according to yet another exemplary embodiment of the present disclosure.

FIG. 11 is a plan view of a light emitting device according to yet another exemplary embodiment of the present disclosure.

Referring to FIG. 11, the light emitting device according to this exemplary embodiment is generally the same as the light emitting device described with reference to FIG. 10A and FIG. 10B except that the first conductive pattern 116a contacts the first conductivity type semiconductor layer 102 between the light emitting cells LEC1_1, LEC1_2, LEC1_3.

First, the first conductivity type semiconductor layer 102 is exposed in regions between the plural light emitting cells LEC1_1, LEC1_2, LEC1_3 such that the exposed regions of the first conductivity type semiconductor layer 102 have an enlarged width in regions between the convex portions of the connection pattern 120.

In addition, the first passivation layer 114 may be formed to expose the first conductivity type semiconductor layer 102 in the regions between the light emitting cells LEC1-1, LEC1-2, LEC1-3 so as to have a relatively great width in the regions between the convex portions of the connection pattern 120.

The first conductive pattern 116a electrically contacts the first conductivity type semiconductor layer 102 exposed through the first passivation layer 114 in the first region AR1. In particular, the first conductive pattern 116a may contact the first conductivity type semiconductor layer 120 over a relatively broad width in the regions between the concave portions or in the regions between the convex portion of the connection pattern 120. In particular, the first conductive pattern 116a may have a relatively great width in the regions between the convex portions of the connection pattern 120.

Although certain exemplary embodiments have been described herein, it should be understood by those skilled in the art that these embodiments are given by way of illustration only, and that various modifications, variations, and alterations can be made without departing from the spirit and scope of the invention. In particular, a feature or component of one exemplary embodiment can also be applied to other exemplary embodiments without departing from the spirit and scope of the present disclosure. Therefore, it should be understood that these embodiments are provided for illustration only and are not to be construed in any way as limiting the present disclosure.

We claim:

1. A light emitting device comprising:
   a first light emitting cell disposed in a first region on a substrate and comprising a first conductivity type semiconductor layer, an active layer, and a second conductivity type semiconductor layer;
   a second light emitting cell disposed in a second region on the substrate to be spaced apart from the first light emitting cell and comprising a first conductivity type semiconductor layer, an active layer, and a second conductivity type semiconductor layer;
   a first conductive pattern disposed in the first region and comprising contact portions electrically connected to the first conductivity type semiconductor layer of the first light emitting cell; and
   a connection pattern disposed between the first light emitting cell and the second light emitting cell and comprising first contact portions electrically connected to the second conductivity type semiconductor layer of the first light emitting cell in the first region and second contact portions electrically connected to the first conductivity type semiconductor layer of the second light emitting cell in the second region,
   wherein, at an edge of the first region facing the second region, at least one contact portion of the first conductive pattern is disposed between the first contact portions of the connection pattern.

2. The light emitting device according to claim 1, wherein the contact portions of the first conductive pattern are disposed along the edge of the first region.

3. The light emitting device according to claim 1, wherein one sidewall of each of the contact portions of the first conductive pattern face the active layer and the second conductivity type semiconductor layer of the first light emitting cell and the other sidewall thereof faces a separation space.

4. The light emitting device according to claim 1, wherein the first conductive pattern comprises concave portions to be indented to form the one contact point of the first conductive pattern; and
   the connection pattern comprises convex portions electrically contacting the first contact portions of the connection pattern and extending from the second region to the first region,
   the concave portions and the convex portions spaced apart from each other via the rest of the first conductive pattern that is not indented.

5. The light emitting device according to claim 1, wherein the first conductive pattern further comprises protruding regions protruding outwards relative to the first light emitting cell at locations corresponding to the contact portions of the first conductive pattern.

6. The light emitting device according to claim 1, wherein each of the second contact portions of the connection pattern is disposed along an edge of the second region, and the connection pattern further comprises protruding regions protruding outwards at locations corresponding to the second contact portions of the connection pattern.

7. The light emitting device according to claim 1, wherein the first region comprises a first side surface facing the second light emitting cell, a second side surface opposite to the first side surface, and third and fourth side surfaces each connecting the first side surface to the second side surface; and the second region comprises a fifth side surface facing the first light emitting cell, a sixth side surface opposite to the fifth side surface, and seventh and eighth side surfaces each connecting the fifth side surface to the sixth side surface.

8. The light emitting device according to claim 7, wherein, in the first region, a group of the contact portions of the first conductive pattern is disposed to face the second light emitting cell in a space between the first contact portions of the connection pattern and the first side surface.

9. The light emitting device according to claim 7, wherein, in the first region, a total area of the contact portions of the first conductive pattern disposed on the first side surface is equal to or less than that of the contact portions of the first conductive pattern disposed on the second side surface; and in the second region, a total area of the contact portions of the connection pattern disposed on the fifth side surface and electrically connected to the first conductivity type semiconductor layer is equal to or less than that of the contact portions of the connection pattern disposed on the sixth side surface and electrically connected to the first conductivity type semiconductor layer.

10. The light emitting device according to claim 9, wherein the contact portions of the first conductive pattern have the same structure;
   in the first region, the number of contact portions of the first conductive pattern disposed on the first side surface is less than the number of contact portions of the first conductive pattern disposed on the second side surface;
   the first contact portions of the connection pattern have the same structure; and
   in the second region, the number of first contact portions of the connection pattern disposed on the fifth side surface is less than the number of first contact portions of the connection portions disposed on the sixth side surface.

11. The light emitting device according to claim 7, wherein each of the contact portions of the first conductive pattern disposed at a corner of the first region defined by the second and third side surfaces thereof and at a corner of the first region defined by the second and fourth side surfaces thereof has an L-shaped structure, and each of the first contact portions of the connection pattern disposed at a corner of the second region defined by the sixth and the seventh side surfaces thereof and at a corner of the second region defined by the sixth and eighth side surfaces thereof has an L-shaped structure.

12. The light emitting device according to claim 7, wherein each of the first and second light emitting cells further comprises:
- an ohmic layer disposed on the second conductivity type semiconductor layer and electrically contacting the second conductivity type semiconductor layer;
- an insulation layer disposed on the ohmic layer and having a plurality of holes; and
- a reflective layer disposed on the insulation layer and comprising contact portions contacting the ohmic layer through the plurality of holes.

13. The light emitting device according to claim 12, wherein one contact portion of the reflective layer of the first light emitting cell is disposed at a corner of the first region defined by the first and third side surfaces of the first region or by the first and fourth side surfaces of the first region and between two adjacent contact portions of the first conductive pattern electrically connected to the first conductivity type semiconductor layer, and
- one contact portion of the reflective layer of the second light emitting cell is disposed at a corner of the second region defined by the fifth and seventh side surfaces of the second region or by the fifth and eighth side surfaces of the second region and between two adjacent contact portions of the connection pattern electrically connected to the first conductivity type semiconductor layer.

14. The light emitting device according to claim 1, further comprising:
- a floating pattern overlapping a separation space between the first and second light emitting cells and insulated from the first and second light emitting cells, the first conductive pattern, and the connection pattern.

15. The light emitting device according to claim 1, further comprising:
- a second conductive pattern disposed in the second region and electrically connected to the second conductivity type semiconductor layer.

16. The light emitting device according to claim 15, further comprising:
- a first electrode pad electrically connected to the first conductive pattern in the first region; and
- a second electrode electrically connected to the second conductive pattern in the second region.

17. The light emitting device according to claim 1, wherein, in the second region, the connection pattern further comprises: a third contact portion disposed at a center of the second light emitting cell and electrically contacting the first conductivity type semiconductor layer of the second light emitting cell; and a protrusion electrically contacting the third contact portion and protruding in a direction from the first region toward the second region.

18. The light emitting device according to claim 17, further comprising:
- a second conductive pattern disposed in the second region, the second conductive pattern being electrically connected to the second conductivity type semiconductor layer and comprising a first pattern portion, a second pattern portion, and a connecting portion connecting the first and second pattern portions separated by the protrusion of the connection pattern.

19. The light emitting device according to claim 1, wherein the first light emitting cell is divided into a plurality of light emitting cells sharing the first conductivity type semiconductor layer and one contact portion of the first conductive pattern is disposed in a region between the plurality of light emitting cells.

20. The light emitting device according to claim 1, wherein the connection pattern comprises protrusions extending from the second region to the first region, and at least one of the protrusions comprises a neck having a relatively narrow width.

* * * * *